(12) United States Patent
Park et al.

(10) Patent No.: US 7,738,189 B2
(45) Date of Patent: Jun. 15, 2010

(54) SIDE EMITTING LENS, AND BACKLIGHT UNIT AND LIQUID CRYSTAL DISPLAY INCLUDING THE SAME

(75) Inventors: Se Ki Park, Suwon (KR); Gi Cherl Kim, Yongin (KR); Seock Hwan Kang, Suwon-si (KR); Eun Jeong Kang, Cheonan (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 218 days.

(21) Appl. No.: 11/928,717

(22) Filed: Oct. 30, 2007

(65) Prior Publication Data
US 2008/0297918 A1     Dec. 4, 2008

(30) Foreign Application Priority Data
Oct. 30, 2006    (KR) ..................... 10-2006-0105849

(51) Int. Cl.
G02B 17/00    (2006.01)
(52) U.S. Cl. ....................... 359/727; 345/102
(58) Field of Classification Search ......... 359/725–736, 359/800; 345/102
See application file for complete search history.

(56) References Cited

U.S. PATENT DOCUMENTS

| | | | |
|---|---|---|---|
| 6,679,621 B2 | 1/2004 | West et al. | |
| 7,524,098 B2 * | 4/2009 | Vennetier et al. | 362/555 |
| 2005/0135441 A1 | 6/2005 | Ng et al. | |
| 2006/0076568 A1 * | 4/2006 | Keller et al. | 257/98 |
| 2006/0091418 A1 | 5/2006 | Chew | |
| 2006/0138437 A1 | 6/2006 | Huang et al. | |
| 2006/0291203 A1 * | 12/2006 | Anandan | 362/231 |
| 2008/0192479 A1 * | 8/2008 | Wanninger | 362/308 |

FOREIGN PATENT DOCUMENTS

| | | |
|---|---|---|
| JP | 2002344027 | 11/2002 |
| JP | 2003197008 | 7/2003 |
| JP | 2003264317 | 9/2003 |
| JP | 200488007 | 3/2004 |
| KR | 1020050112721 | 12/2005 |
| KR | 1020060012959 | 2/2006 |
| KR | 1020060033572 | 4/2006 |
| KR | 1020060035042 | 4/2006 |
| KR | 1020060055706 | 5/2006 |
| KR | 1020060057837 | 5/2006 |
| KR | 100593933 | 6/2006 |
| KR | 1020060074937 | 7/2006 |
| KR | 100611922 | 8/2006 |

* cited by examiner

*Primary Examiner*—Jordan M. Schwartz
(74) *Attorney, Agent, or Firm*—H. C. Park & Associates, PLC

(57) ABSTRACT

The present invention provides a side emitting lens that may reduce optical loss and improve light emitting ratios, and a backlight unit and liquid crystal display including the side emitting lens. The side emitting lens may have a substantially dome-shaped body. The body includes a base part on which external light is incident, a refracting part to refract incident light and emit the light from side surfaces, and a reflecting part. The reflecting part is in the shape of a conical recess at a central portion of the refracting part to fully reflect the incident light toward one of the refracting part and the base part and the reflecting part comprises two or more reflecting surfaces. Each of the two or more reflecting surfaces is a curved surface.

19 Claims, 19 Drawing Sheets

| POSITION \ TYPE | FIRST EMBODIMENT | SECOND EMBODIMENT | THIRD EMBODIMENT | FOURTH EMBODIMENT |
|---|---|---|---|---|
| DET1 | 44.42% | 53.60% | 48.66% | 28.25% |
| DET2 | 2.24% | 3.78% | 5.64% | 5.14% |
| DET3 | 2.26% | 3.74% | 5.61% | 5.03% |
| DET4 | 2.25% | 3.74% | 5.62% | 5.12% |
| DET5 | 2.28% | 3.75% | 5.70% | 5.09% |
| DET6 | 27.06% | 19.60% | 17.65% | 40.98% |
| SIDE SURFACES (DET2~5) | 9.03% | 15.01% | 22.57% | 20.38% |
| SIDE SURFACES AND LOWER SURFACE (DET2~6) | 36.09% | 34.61% | 40.22% | 61.36% |

FIG. 17

| POSITION \ TYPE | PRESENT INVENTION | RELATED ART |
|---|---|---|
| DET1 | 23.64% | 35.30% |
| DET2 | 2.39% | 2.62% |
| DET3 | 2.40% | 2.59% |
| DET4 | 2.76% | 2.67% |
| DET5 | 2.75% | 2.70% |
| DET6 | 39.87% | 30.59% |
| SIDE SURFACES (DET2~5) | 10.3% | 10.58% |
| SIDE SURFACES AND LOWER SURFACE (DET2~6) | 50.17% | 41.17% |

SIDE EMITTING LENS, AND BACKLIGHT UNIT AND LIQUID CRYSTAL DISPLAY INCLUDING THE SAME

CROSS REFERENCE TO RELATED APPLICATION

This application claims priority from and the benefit of Korean Patent Application No. 10-2006-0105849, filed on Oct. 30, 2006, which is hereby incorporated by reference for all purposes as if fully set forth herein.

BACKGROUND OF THE INVENTION

1. Field of the Invention

The present invention relates to a side emitting lens, a backlight unit including the side emitting lens, and a liquid crystal display including the side emitting lens. More particularly, the present invention relates to a side emitting lens that may reduce optical loss and improve light emitting ratios, and a backlight unit and liquid crystal display including the side emitting lens.

2. Discussion of the Background

Light emitting diodes (LED), fluorescent lamps, metal halide lamps, and the like have been used as light sources for backlights of liquid crystal displays. Light emitting diodes have a long life span and do not require separate inverters. Further, light emitting diodes provide a thin and uniform backlight and have low power consumption. For these reasons, light emitting diodes tend to be widely used as a light source of a backlight for a liquid crystal display.

Direct-type backlights using light emitting diodes are classified as top emitting backlights and side emitting backlights on the basis of light emitting types thereof. Due to the optical efficiency of light emitting diodes, top emitting backlights are commonly used. However, top emitting backlights using light emitting diodes have lower light distribution and light uniformity than side emitting backlights.

Also, if the optical efficiency of the light emitting diode increases and exceeds the optical efficiency of a cold cathode fluorescent lamp, side emitting backlights, which have better light distribution and light uniformity than top emitting backlights, will become even more desirable.

When a general side emitting backlight employing light emitting diodes is used, primary optical loss occurs when light emitted from side surfaces of the lens is reflected by a bottom surface of the lens. Secondary optical loss is caused when light having a changed light path passes through a light guide plate. Then, since dot patterns printed on the light guide plate block the light emitted upward, tertiary optical loss may be caused.

Accordingly, there is a demand for a side emitting lens that can reduce optical loss and improve the light emitting ratios of the side surfaces and the lower surface of the lens, thereby improving the optical efficiency of a side emitting backlight employing light emitting diodes.

SUMMARY OF THE INVENTION

The present invention provides a side emitting lens that may reduce optical loss and refract incident light from light emitting diodes to improve light emitting ratios on the side surfaces and the lower surface of the lens.

The present invention also provides a backlight unit including the side emitting lens.

The present invention also provides a liquid crystal display having a backlight unit including the side emitting lens.

Additional features of the invention will be set forth in the description which follows, and in part will be apparent from the description, or may be learned by practice of the invention.

The present invention discloses a side emitting lens including a substantially dome-shaped body. The body includes a base part on which light is incident from the outside, a refracting part that refracts incident light and emits the light from side surfaces of the lens, and a reflecting part. The reflecting part is in the shape of a conical recess at a central portion of the refracting part to fully reflect the incident light toward at least one of the refracting part and the base part and includes two or more reflecting surfaces. Each of the two or more reflecting surfaces is a curved surface.

The present invention also discloses a backlight unit including light emitting diodes and light source units. Each light emitting diode includes a substrate, a light emitting chip mounted on the substrate, and a molding part for sealing the light emitting chip. The light source units are disposed on the light emitting diodes and each includes a side emitting lens for emitting light from side surfaces of the light emitting diodes. The side emitting lens has a substantially dome-shaped body. The body includes a base part on which light is incident from the outside, a refracting part that refracts incident light and emits the light from side surfaces of the lens, and a reflecting part. The reflecting part is in the shape of a conical recess at a central portion of the refracting part to fully reflect the incident light toward any one of the refracting part and the base part and includes two or more reflecting surfaces. Each of the two or more reflecting surfaces is a curved surface, and the refracting part includes at least one refracting surface that is a curved surface.

The present invention also discloses a liquid crystal display having a backlight unit, including light emitting diodes and light source units, and a liquid crystal display panel. Each light emitting diode includes a substrate, a light emitting chip mounted on the substrate, and a molding part for sealing the light emitting chip. The light source units are disposed on the light emitting diodes and each light source unit includes a side emitting lens for emitting light emitted from side surfaces of the light emitting diodes. The liquid crystal display panel is disposed on the upper side of the backlight unit and displays images. The side emitting lens includes a substantially dome-shaped body. The body includes a base part on which light is incident from the outside, a refracting part that refracts incident light and emits the light from the side surfaces, and a reflecting part. The reflecting part is in the shape of a conical recess at a central portion of the refracting part to fully reflect the incident light toward any one of the refracting part and the base part and includes two or more reflecting surfaces. Each of the two or more reflecting surfaces of the reflecting surfaces is a curved surface, and the refracting part includes at least one refracting surface that is a curved surface.

It is to be understood that both the foregoing general description and the following detailed description are exemplary and explanatory and are intended to provide further explanation of the invention as claimed.

BRIEF DESCRIPTION OF THE DRAWINGS

The patent or application file contains at least one drawing executed in color. Copies of this patent or patent application publication with color drawings will be provided by the Office upon request and payment of the necessary fee.

The accompanying drawings, which are included to provide a further understanding of the invention and are incorporated in and constitute a part of this specification, illustrate embodiments of the invention, and together with the description serve to explain the principles of the invention.

FIG. 17 is a table in which the light emitting ratios of the conventional backlight unit are compared with those of the backlight unit according to an exemplary embodiment of the present invention.

DETAILED DESCRIPTION OF THE ILLUSTRATED EMBODIMENTS

Figure 1:
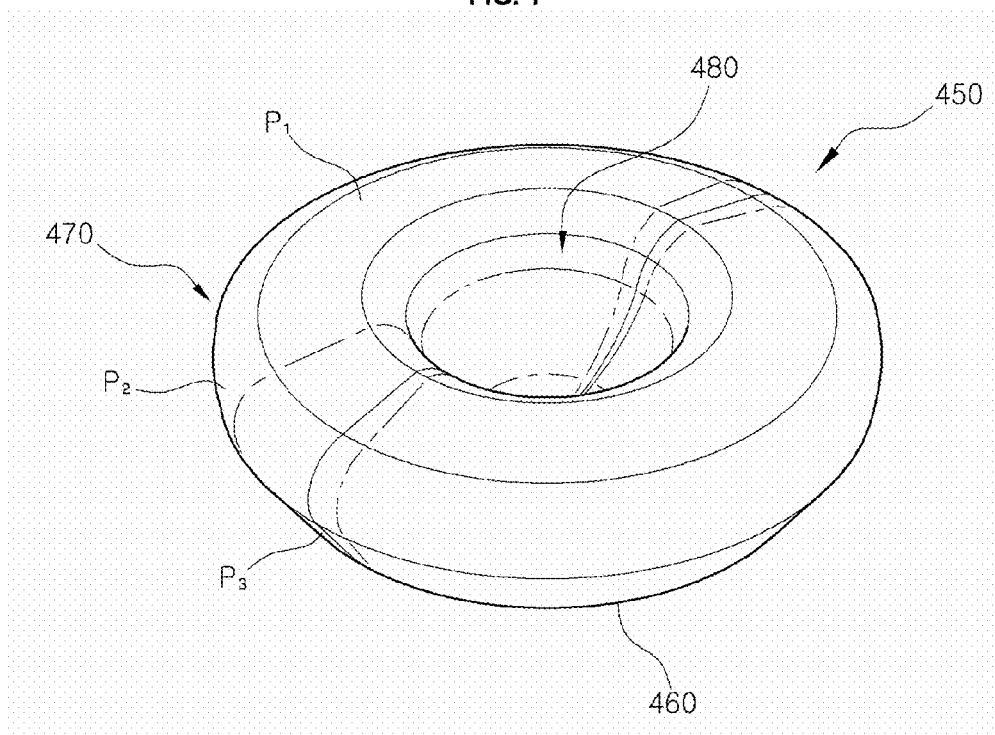
FIG. 1 is a perspective view of a side emitting lens according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of the layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
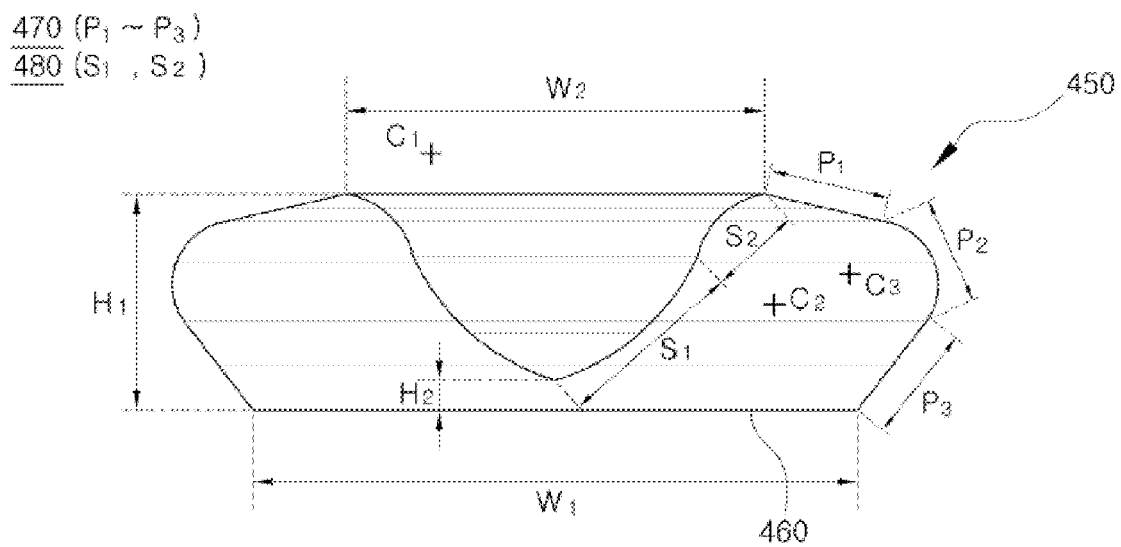
FIG. 2 is a cross-sectional view of the side emitting lens shown in FIG. 1.

FIG. 1 is a perspective view of a side emitting lens according to a first exemplary embodiment of the present invention, and FIG. 2 is a cross-sectional view of the side emitting lens shown in FIG. 1.

Referring to FIG. 1, a side emitting lens 450 may have a substantially dome-shaped body. The side emitting lens 450 includes a base part 460 forming a bottom of the body, a refracting part 470 forming an outer surface of the body, and a reflecting part 480 disposed on the refracting part 470.

External light is incident on the base part 460, that is, light emitted from a light emitting diode is incident on the base part 460.

The refracting part 470 is adjacent to the base part 460 and is formed on the base part 460 to have a dome shape. The refracting part 470 refracts light that is incident on the base part 460 or light having a changed light path due to the reflecting part 480, and emits light through side surfaces (and a lower surface) of the side emitting lens 450.

The reflecting part 480 is in the shape of a conical recess at a central portion of the refracting part 470 and fully reflects light incident on the base part 460 in a predetermined direction. That is, light incident on the base part 460 is fully reflected by the reflecting part 480, which changes the light path of light incident on the base part 460 so that it is directed toward the refracting part 470 or the base part 460.

Total reflection is when incident light is fully reflected. This occurs when light is incident on a medium (a material having a small refractive index) from an optically denser medium (a material having a large refractive index) and the incident angle is larger than the critical angle. The side emitting lens 450 according to the first exemplary embodiment of the present invention is made of a material denser than air. Accordingly, if the reflecting part 480 is formed to have a critical angle that causes total reflection, incident light may be fully reflected by the reflecting part 480 and it may be possible to minimize light emitted from the upper portion of the side emitting lens 450.

The side emitting lens 450 may be made of a transparent resin having a refractive index of 1 or more, for example, polymethylmethacrylate (PMMA), polycarbonate (PC), epoxy resin, or acrylic resin. The transparent resin may have a refractive index of about 1.5. Further, the side emitting lens 450 may be formed by various manufacturing methods such as transfer molding or injection molding. Furthermore, the side emitting lens 450 is molded to have the above-mentioned shape and then hardened by heat radiation or UV radiation.

Hereinafter, the structure of the side emitting lens according to the first exemplary embodiment of the present invention will be described in detail with reference to FIG. 2.

The side emitting lens 450 in general is formed as a substantially dome-shaped body. The body includes the base part 460, the refracting part 470, and the reflecting part 480. The reflecting part 480 is in the shape of a conical recess at an upper central portion of the refracting part 470.

The base part 460 has a circular shape. However, the shape of the base part 460 is not limited to a circular shape and may be modified in various ways to correspond to the shape of a light emitting diode. In this exemplary embodiment, the diameter $W_1$ of the base part 460 is 9.40 mm.

The units of height, diameter, radius, and length are millimeters in this specification. Accordingly, the units thereof will be omitted below and only numerical values thereof will be described.

The reflecting part 480 includes a first reflecting surface $S_1$ and a second reflecting surface $S_2$. The first reflecting surface $S_1$ is adjacent to a vertex of the recess, and the second reflecting surface $S_2$ is connected to the first reflecting surface $S_1$ and is adjacent to an inlet of the recess.

In this case, each of the first reflecting surface $S_1$ and the second reflecting surface $S_2$ is formed of a curved surface having a predetermined curvature. In this embodiment, the radius of curvature of the first reflecting surface $S_1$ is 4.54, and the radius of curvature of the second reflecting surface $S_2$ is 1.82. The center $C_1$ of the radius of curvature of the first reflecting surface $S_1$ is located outside the side emitting lens 450 and above the base part 460, and the center $C_2$ of the radius of curvature of the second reflecting surface $S_2$ is located inside the side emitting lens 450.

The refracting part 470 includes a first refracting surface $P_1$, a second refracting surface $P_2$, and a third refracting surface $P_3$. The first refracting surface $P_1$ is adjacent to the second reflecting surface $S_2$ and the third refracting surface $P_3$ is adjacent to the base part 460. Further, the second refracting surface $P_2$ is disposed between the first refracting surface $P_1$ and the third refracting surface $P_3$.

In this case, the second refracting surface $P_2$ is a curved surface having a predetermined curvature and each of the first refracting surface $P_1$ and the third refracting surface $P_3$ is a flat surface. Further, each of the first refracting surface $P_1$ and the third refracting surface $P_3$ is inclined with respect to the base part 460 by a predetermined angle. In this embodiment, the radius of curvature of the second refracting surface $P_2$ is 1 and the center $C_3$ of the radius of curvature of the second refracting surface $P_2$ is located inside the side emitting lens 450.

In this exemplary embodiment, the height $H_1$ of the side emitting lens 450 is 3.53 and the distance $H_2$ between the base part 460 and the vertex of the recess of the reflecting part 480 is 0.43. The diameter $W_2$ of the inlet of the reflecting part 480, that is, the inlet of the recess, is 6.29.

The above-mentioned numerical values of the radii of curvature, the diameters, and the distances of the side emitting lens are only exemplary numerical values and the present invention is not limited to the above-mentioned numerical values. Accordingly, the radii of curvature, the diameters, and the distances may be modified. This also applies to the exemplary embodiments described below.

Figure 3A:
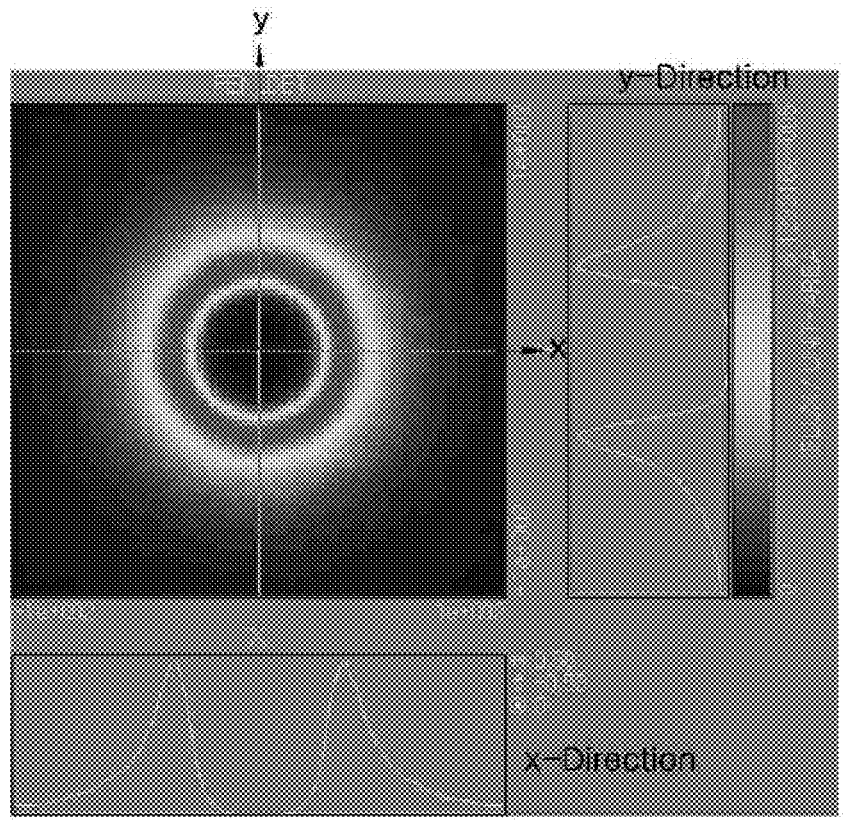
FIG. 3A, FIG. 3B, and FIG. 3C are views showing the simulation results of light distribution of the side emitting lens according to the first exemplary embodiment.
Figure 3B:
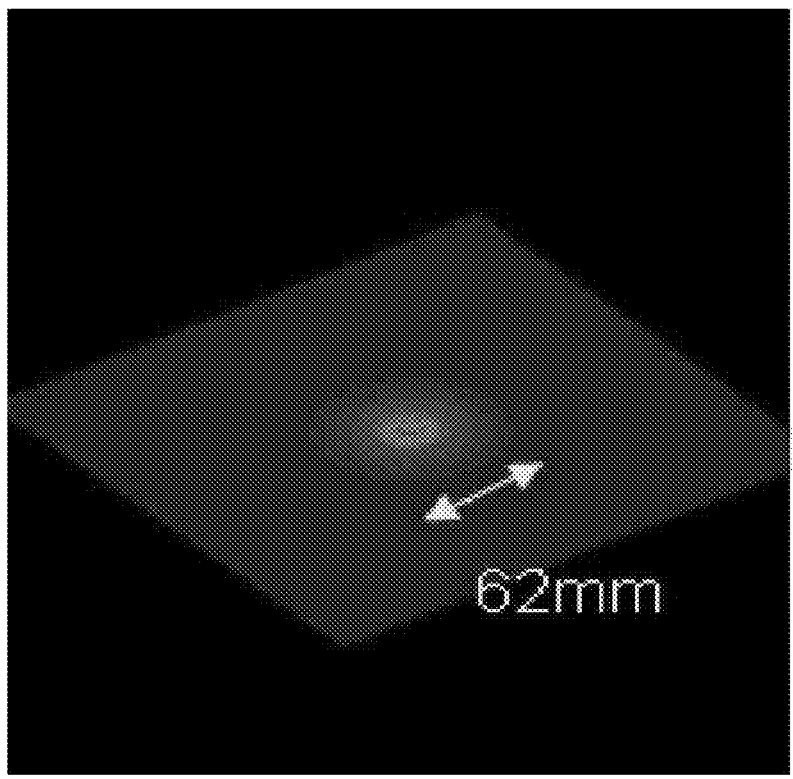
Figure 3C:
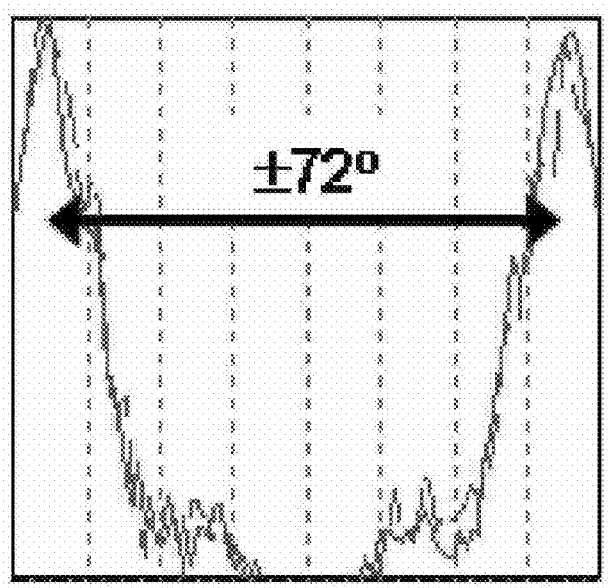

FIG. 3A, FIG. 3B, and FIG. 3C are views showing the simulation results of light distribution of the side emitting lens according to the first exemplary embodiment.

FIG. 3A shows the results obtained from a simulation of light distribution, in which light is emitted from the side emitting lens and incident on a plate after the plate is disposed above of the side emitting lens. FIG. 3B shows the results obtained from a simulation of light distribution, in which light is emitted from the side emitting lens and is projected onto a plate after the plate is disposed below the side emitting lens. FIG. 3C shows the distribution results of the directional angle of light, which is emitted from the side emitting lens.

As shown in FIG. 3A, FIG. 3B, and FIG. 3C, it is understood that light emitting from the side emitting lens according to the first exemplary embodiment of the present invention is minimally emitted from the upper central portion of the side emitting lens where the reflecting part is formed, and is maximally emitted from the side surface and the lower surface thereof. That is, it is understood that light is minimally emitted from a portion corresponding to a directional angle of light at 0° (a central portion of the side emitting lens) and maximum light is emitted from a portion corresponding to a directional angle of light at ±72°. In addition, as shown in FIG. 3B, the diameter of the light distribution pattern projected on the lower side of the side emitting lens is about 62.

Figure 4:
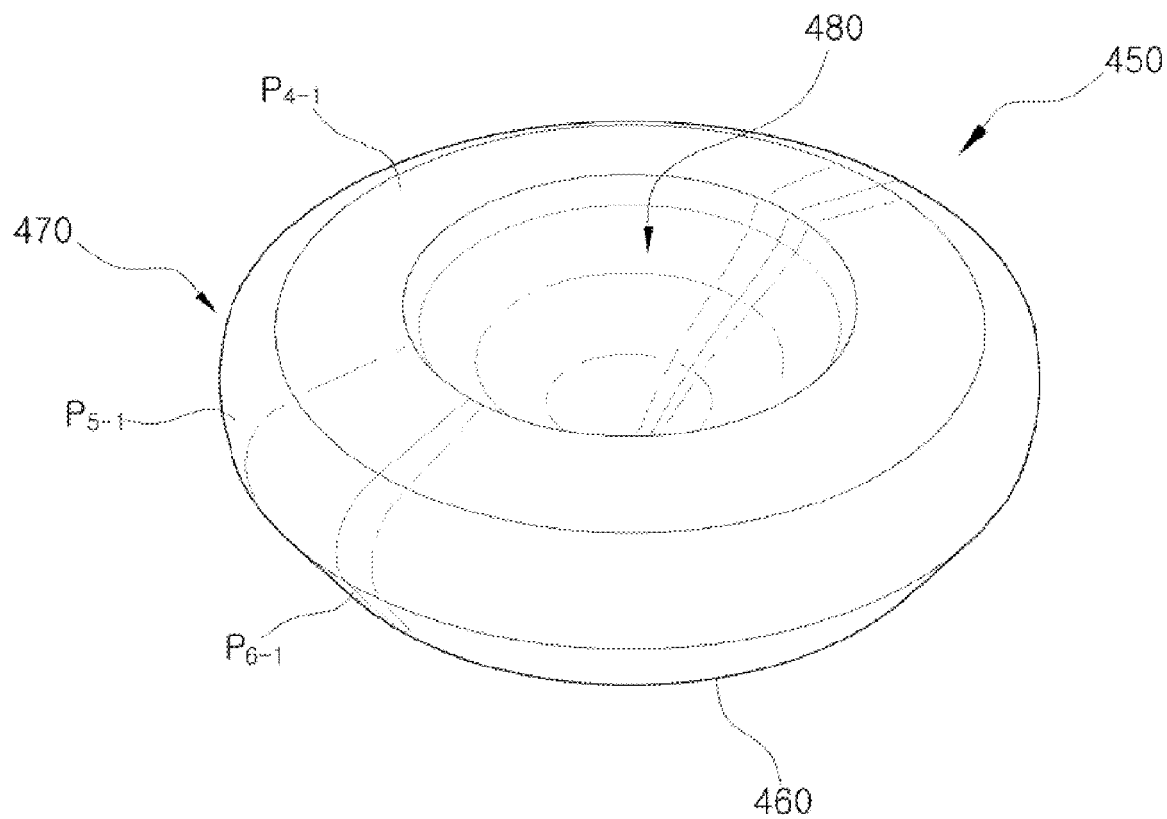
FIG. 4 is a perspective view of a side emitting lens according to a second exemplary embodiment of the present invention.
Figure 5:
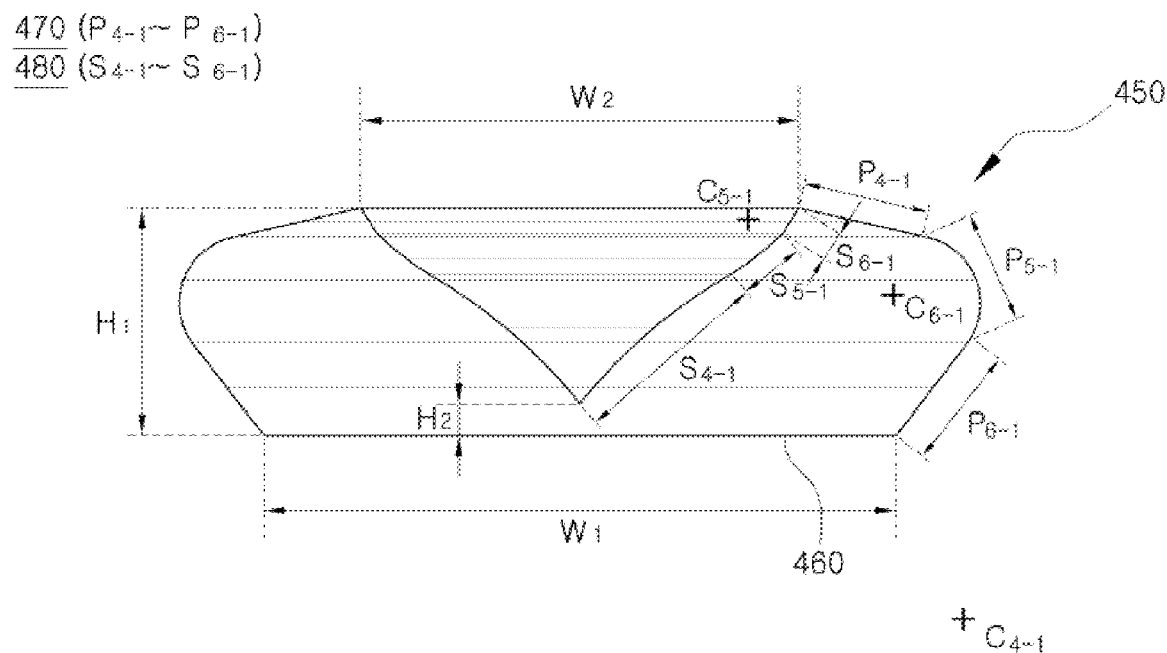
FIG. 5 is a cross-sectional view of the side emitting lens shown in FIG. 4.
Figure 6A:
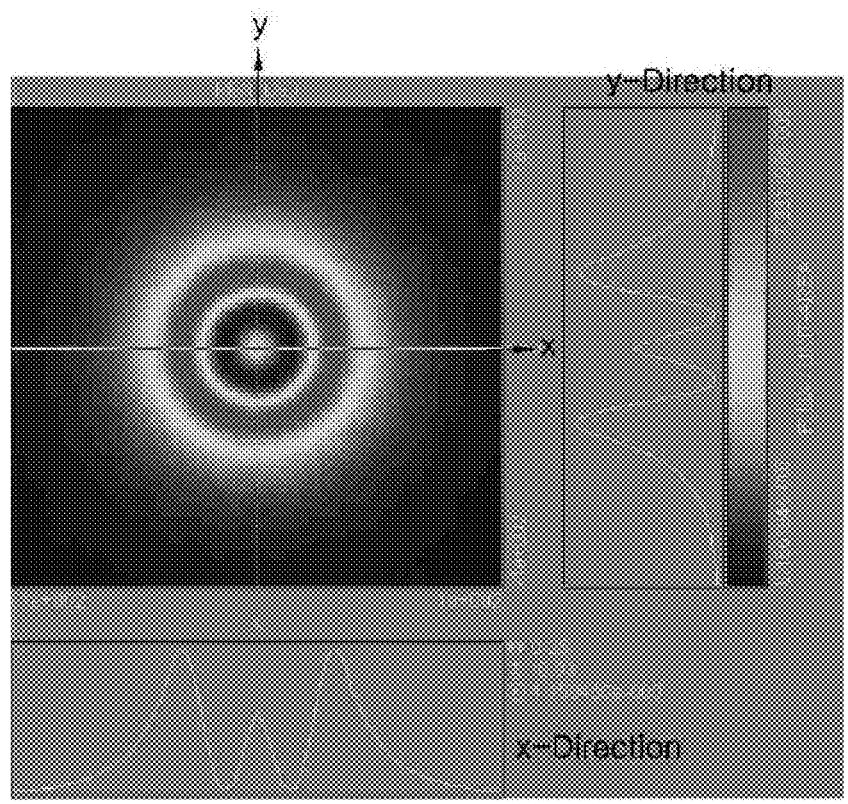
FIG. 6A, FIG. 6B, and FIG. 6C are views showing the simulation results of light distribution of the side emitting lens according to the second exemplary embodiment.
Figure 6B:
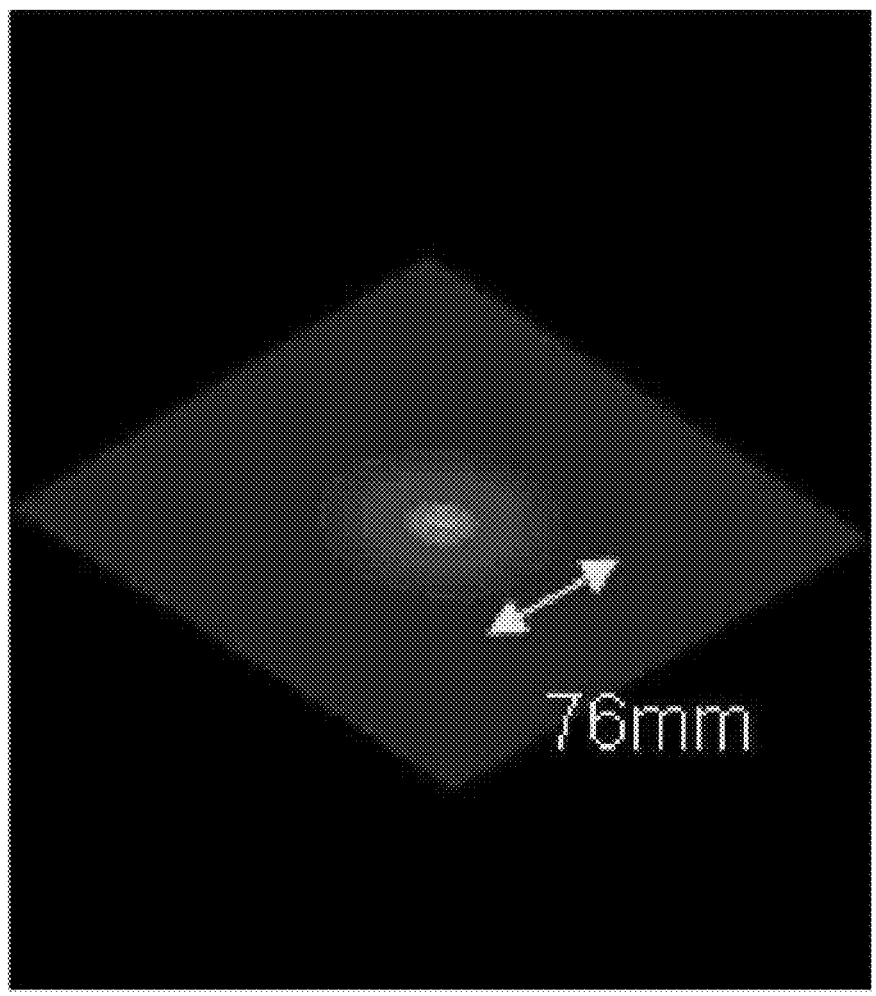
Figure 6C:
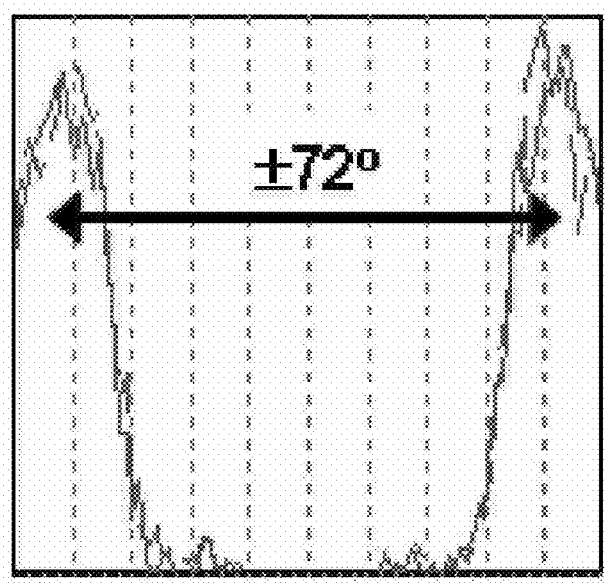

FIG. 4 is a perspective view of a side emitting lens according to a second exemplary embodiment of the present invention, and FIG. 5 is a cross-sectional view of the side emitting lens shown in FIG. 4. Further, FIG. 6A, FIG. 6B, and FIG. 6C are views showing the simulation results of light distribution of the side emitting lens according to the second exemplary embodiment. The following side emitting lens, according to a second exemplary embodiment of the present invention, has substantially the same structure as the side emitting lens according to the above-mentioned first exemplary embodiment, except for the structure of the reflecting part. Accordingly, the difference between the structures of the reflecting parts will be described below.

Referring to FIG. 4 and FIG. 5, a side emitting lens 450, may have a substantially dome-shaped body. The body includes a base part 460, a refracting part 470, and a reflecting part 480. The reflecting part 480 is in the shape of a conical recess at an upper central portion of the refracting part 470.

The base part 460 has a circular shape. However, the shape of the base part 460 is not limited to a circular shape and may be modified in various ways to correspond to the shape of a light emitting diode. In this embodiment, the diameter $W_1$ of the base part 460 is 9.40.

The reflecting part 480 includes a fourth reflecting surface $S_{4-1}$, a fifth reflecting surface $S_{5-1}$, and a sixth reflecting surface $S_{6-1}$. The fourth reflecting surface $S_{4-1}$ is adjacent to a vertex of the recess, and the sixth reflecting surface $S_{6-1}$ is adjacent to an inlet of the recess. The fifth reflecting surface $S_{5-1}$ is disposed between the fourth reflecting surface $S_{4-1}$ and the sixth reflecting surface $S_{6-1}$.

In this case, each of the fourth reflecting surface $S_{4-1}$ and the fifth reflecting surface $S_{5-1}$ is a curved surface having a predetermined curvature, and the sixth reflecting surface $S_{6-1}$ is a flat surface. In this embodiment, the radius of curvature of the fourth reflecting surface $S_{4-1}$ is 9.63, and the radius of curvature of the fifth reflecting surface $S_{5-1}$ is 1.2. The center $C_{4-1}$ of the radius of curvature of the fourth reflecting surface $S_{4-1}$ is located outside the side emitting lens 450 and below the base part 460, and the center $C_{5-1}$ of the radius of curvature of the fifth reflecting surface $S_{5-1}$ is located outside the side emitting lens 450 and above the base part 460.

The refracting part 470 includes a fourth refracting surface $P_{4-1}$, a fifth refracting surface $P_{5-1}$, and a sixth refracting surface $P_{6-1}$. The fourth refracting surface $P_{4-1}$ is adjacent to the sixth reflecting surface $S_{6-1}$, and the sixth refracting surface $P_{6-1}$ is adjacent to the base part 460. The fifth refracting surface $P_{5-1}$ is disposed between the fourth refracting surface $P_{4-1}$ and the sixth refracting surface $P_{6-1}$.

In this case, the fifth refracting surface $P_{5-1}$ is a curved surface having a predetermined curvature, and each of the fourth refracting surface $P_{4-1}$ and the sixth refracting surface $P_{6-1}$ is a flat surface. Further, each of the fourth refracting surface $P_{4-1}$ and the sixth refracting surface $P_{6-1}$ is inclined with respect to the base part 460 at a predetermined angle. In this embodiment, the radius of curvature of the fifth refracting surface $P_{5-1}$ is 1 and the center $C_{6-1}$ of the radius of curvature of the fifth refracting surface $P_{5-1}$ is located inside the side emitting lens 450.

In this exemplary embodiment, the height $H_1$ of the side emitting lens 450, the distance $H_2$ between the base part 460 and the vertex of the recess of the reflecting part 480, and the diameter $W_2$ of the inlet of the reflecting part 480, that is, the inlet of the recess are the same as those in the first exemplary embodiment.

As shown in FIG. 6A, FIG. 6B, and FIG. 6C, it is understood that light emitting from the side emitting lens according to the second exemplary embodiment of the present invention is minimally emitted from the upper central portion of the side emitting lens where the reflecting part is formed, and is maximally emitted from the side surface and the lower surface thereof. That is, it is understood that light is minimally emitted from a portion corresponding to a directional angle of light at 0° (a central portion of the side emitting lens) and the maximum amount light is emitted from a portion corresponding to a directional angle of light at ±72°. In addition, as shown in FIG. 6B, it is understood that the diameter of the light distribution pattern projected on the lower side of the side emitting lens is about 76.

The diameter of the light distribution pattern and the amount of light emitted from the central portion of the side emitting lens according to the second exemplary embodiment were greater than those of the side emitting lens according to the first exemplary embodiment.

Figure 7:
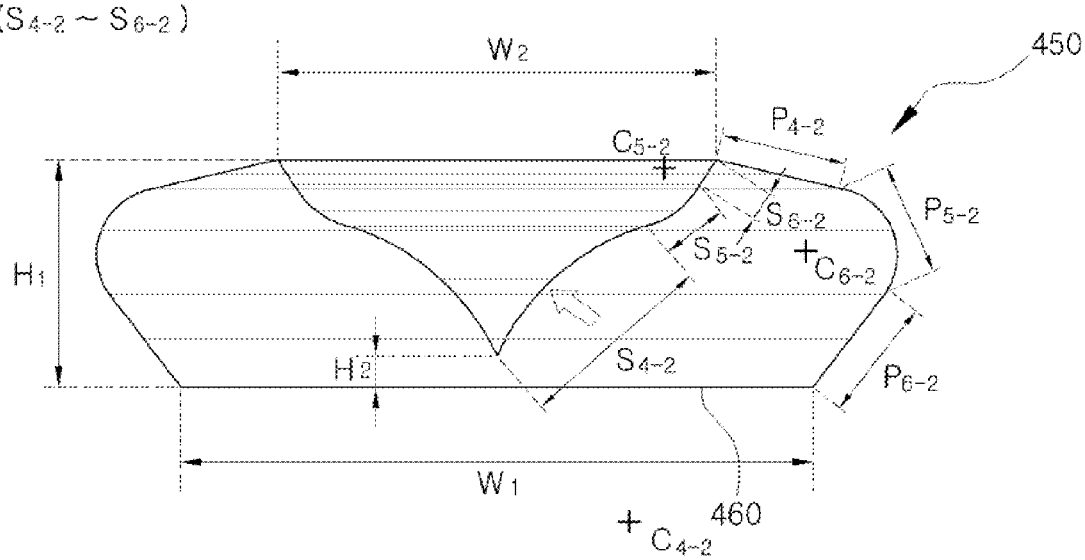
FIG. 7 is a cross-sectional view of a side emitting lens according to a third exemplary embodiment of the present invention.
Figure 8A:
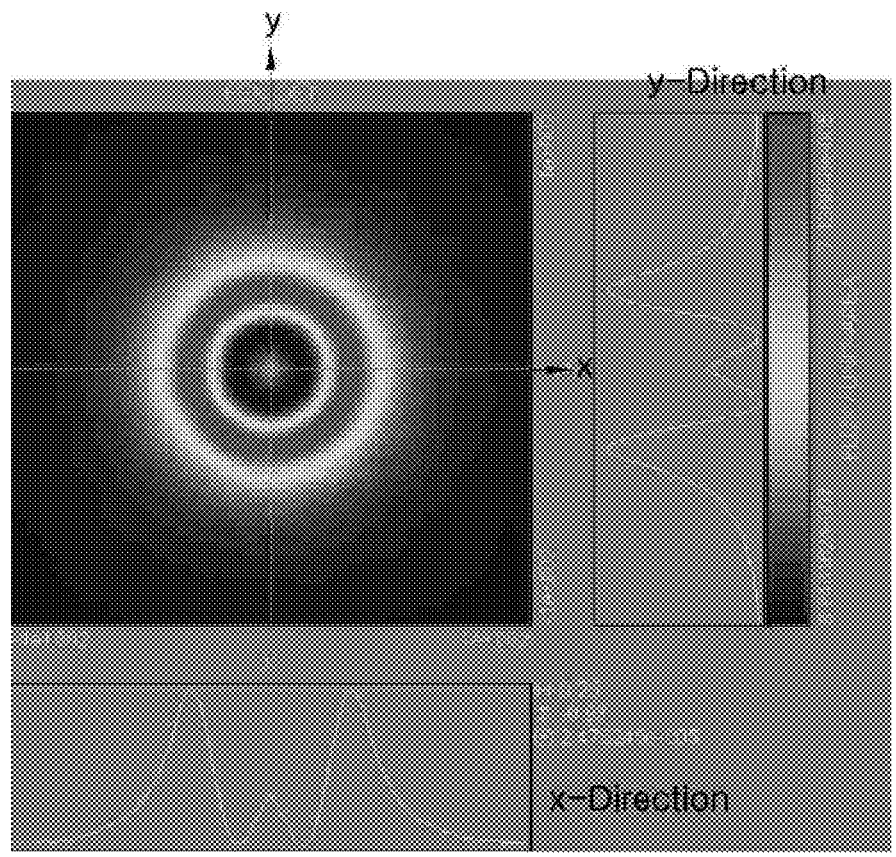
FIG. 8A, FIG. 8B, and FIG. 8C are views showing the simulation results of light distribution of the side emitting lens according to the third exemplary embodiment.
Figure 8B:
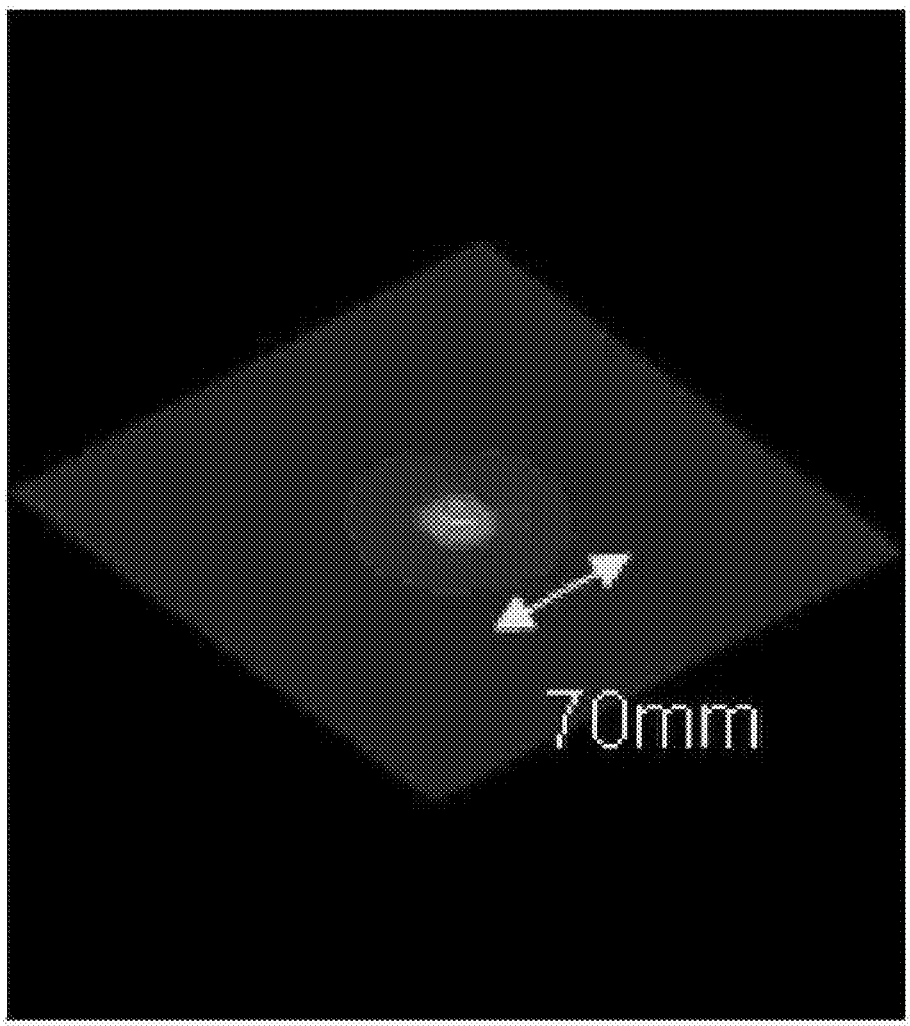
Figure 8C:
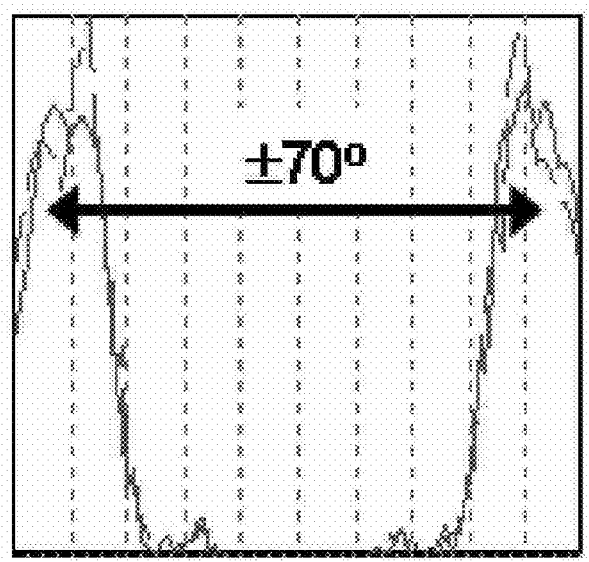

FIG. 7 is a cross-sectional view of a side emitting lens according to a third exemplary embodiment of the present invention, and FIG. 8A, FIG. 8B, and FIG. 8C are views showing the simulation results of light distribution of the side emitting lens according to the third exemplary embodiment. The side emitting lens according to the third exemplary embodiment has substantially the same structure as the side emitting lens according to the above-mentioned second exemplary embodiment, except for the radius of curvature of the reflecting surface in the reflecting part. Accordingly, the difference between the radii of curvature will be described below.

Referring to FIG. 7, a reflecting part 480 includes a fourth reflecting surface $S_{4-2}$, a fifth reflecting surface $S_{5-2}$, and a sixth reflecting surface $S_{6-2}$. In this case, each of the fourth reflecting surface $S_{4-2}$ and the fifth reflecting surface $S_{5-2}$ is a curved surface having a predetermined curvature, and the sixth reflecting surface $S_{6-2}$ is a flat surface inclined with respect to a base part 460 by a predetermined angle. In this exemplary embodiment, the radius of curvature of the fourth reflecting surface $S_{4-2}$ is 4.44 and the radius of curvature of the fifth reflecting surface $S_{5-2}$ is 2. In addition, the center $C_{4-2}$ of the radius of curvature of the fourth reflecting surface $S_{4-2}$ is located outside the side emitting lens 450 and below the base part 460, and the center $C_{5-2}$ of the radius of curvature of the fifth reflecting surface $S_{5-2}$ is located outside the side emitting lens 450 and above the base part 460.

A refracting part 470 includes a fourth refracting surface $P_{4-2}$, a fifth refracting surface $P_{5-2}$, and a sixth refracting surface $P_{6-2}$. The structure of the refracting part 470 is the same as that of the refracting part according to the second exemplary embodiment.

Referring to FIG. 8A, FIG. 8B, and FIG. 8C, it is understood that light emitting from the side emitting lens according to the third embodiment of the present invention is minimally emitted from the upper central portion of the side emitting lens where the reflecting part is formed and is maximally emitted from the side surface and the lower surface thereof. That is, it is understood that light is minimally emitted from a portion corresponding to a directional angle of light at 0° (a central portion of the side emitting lens) and the maximum amount of light is emitted from a portion corresponding to a directional angle of light at ±70°. In addition, as shown in FIG. 6B, the diameter of the light distribution pattern projected on the lower side of the side emitting lens is about 70.

The diameter of the light distribution pattern and the amount of light emitted from the central portion of the side emitting lens according to the third exemplary embodiment were less than those of the side emitting lens according to the second exemplary embodiment.

Figure 9:
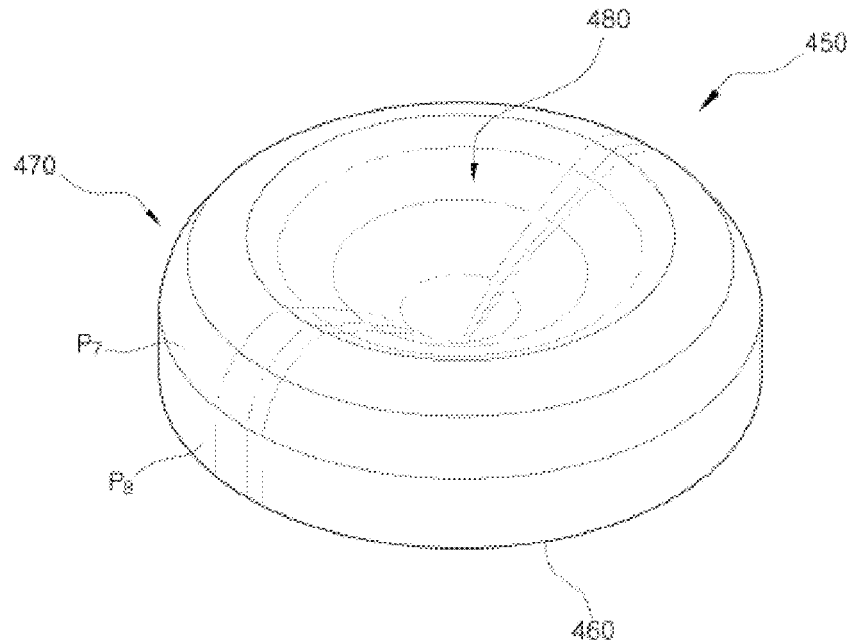
FIG. 9 is a perspective view of a side emitting lens according to a fourth exemplary embodiment of the present invention.
Figure 10:
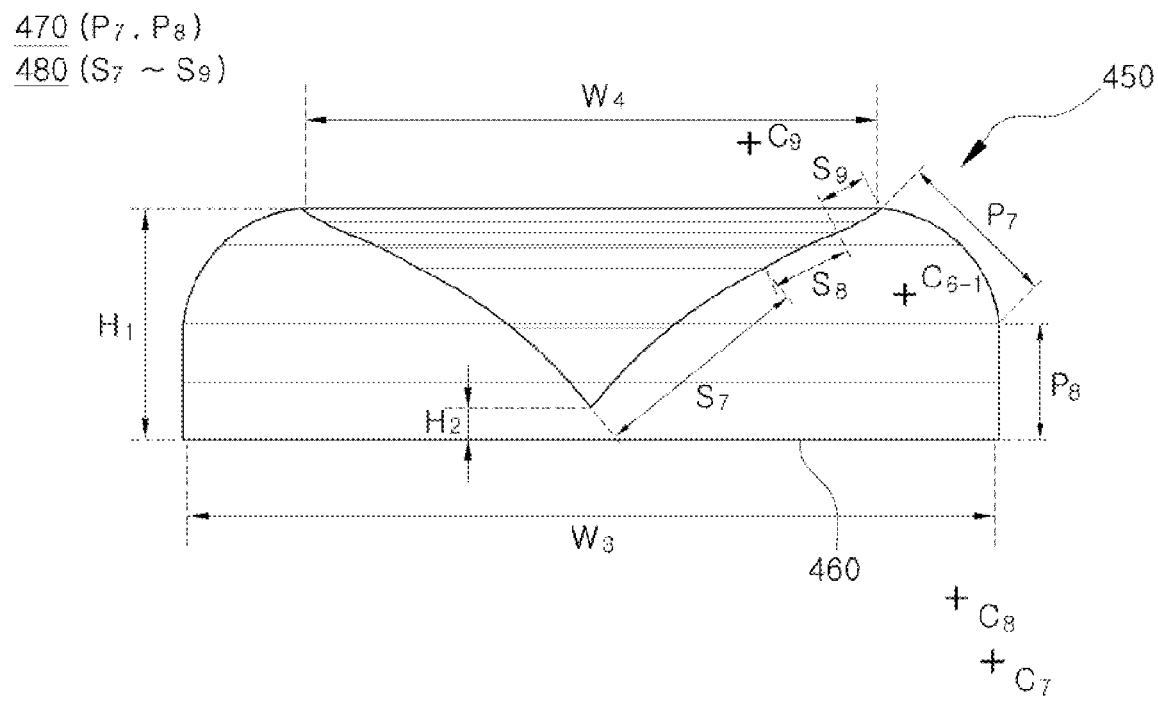
FIG. 10 is a cross-sectional view of the side emitting lens shown in FIG. 9.
Figure 11A:
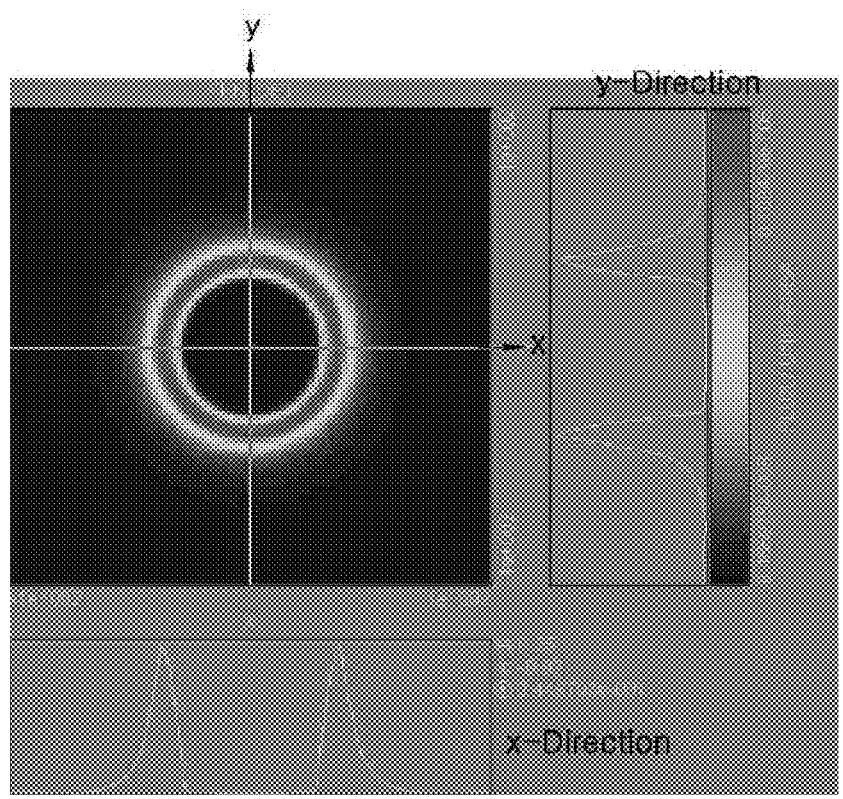
FIG. 11A, FIG. 11B, and FIG. 11C are views showing the simulation results of light distribution of the side emitting lens according to the fourth exemplary embodiment.
Figure 11B:
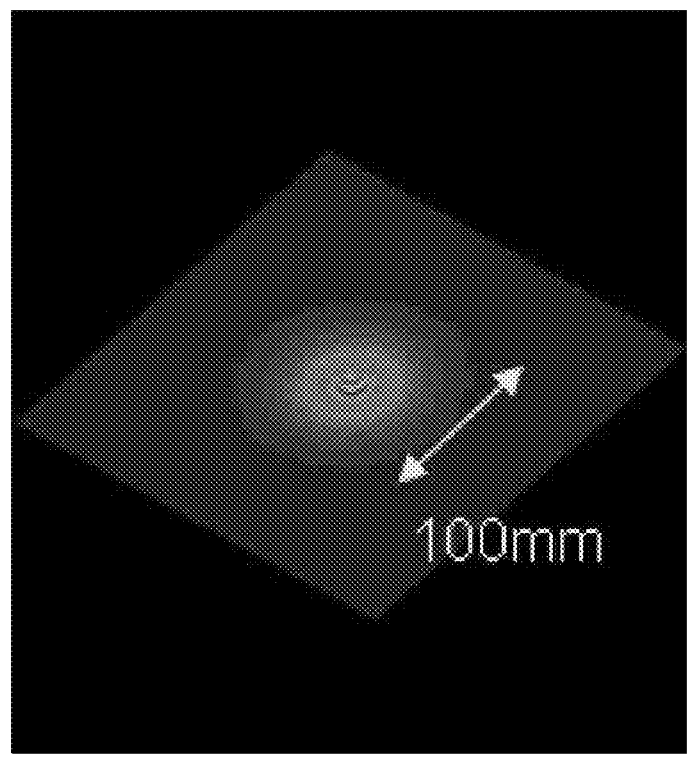
Figure 11C:
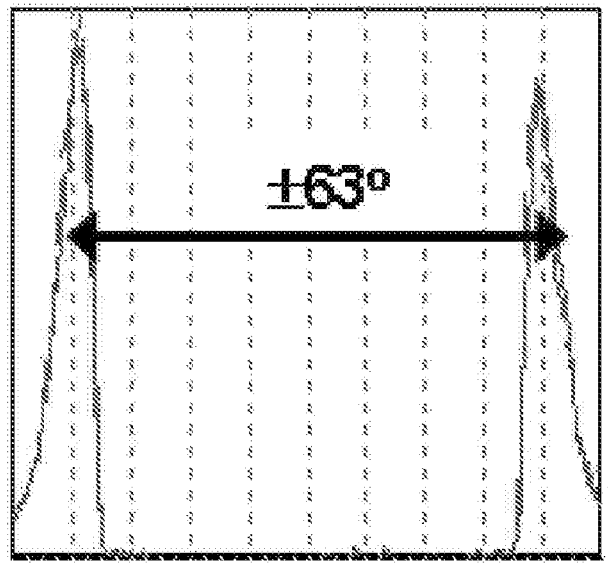

FIG. 9 is a perspective view of a side emitting lens according to a fourth exemplary embodiment of the present invention, and FIG. 10 is a cross-sectional view of the side emitting lens shown in FIG. 9. Further, FIG. 11A, FIG. 11B, and FIG. 11C are views showing the simulation results of light distribution of the side emitting lens according to the fourth exemplary embodiment. The following side emitting lens according to the fourth exemplary embodiment has substantially the same structure as the side emitting lens according to the above-mentioned exemplary embodiments, except that the reflecting part includes three reflecting surfaces and the refracting part includes two refracting surfaces. Accordingly, the different structure will be described below.

Referring to FIG. 9 and FIG. 10, a side emitting lens may have a substantially dome-shaped body. The body includes a base part 460, a refracting part 470, and a reflecting part 480. The reflecting part 480 is formed in the shape of a conical recess at an upper central portion of the refracting part 470.

The base part 460 may have a circular shape. However, the shape of the base part 460 is not limited to a circular shape and may be modified so as to correspond to the shape of a light emitting diode. In this embodiment, the diameter $W_3$ of the base part 460 is 12.

The reflecting part 480 includes a seventh reflecting surface $S_7$, an eighth reflecting surface $S_8$, and a ninth reflecting surface $S_9$. The seventh reflecting surface $S_7$ is adjacent to a vertex of the recess, and the ninth reflecting surface $S_9$ is adjacent to an inlet of the recess. Further, the eighth reflecting surface $S_8$ is formed between the seventh reflecting surface $S_7$ and the ninth reflecting surface $S_9$.

In this case, each of the seventh reflecting surface $S_7$, the eighth reflecting surface $S_8$, and the ninth reflecting surface $S_9$ is a curved surface having a predetermined curvature. In this exemplary embodiment, the radius of curvature of the seventh reflecting surface $S_7$ is 8.75, the radius of curvature of the eighth reflecting surface $S_8$ is 7, and the radius of curvature of the ninth reflecting surface $S_9$ is 2.98. Further, the centers $C_7$ and $C_8$ of the radii of curvature of the seventh reflecting surface $S_7$ and the eighth reflecting surface $S_8$, respectively, are located outside the side emitting lens 450 and below the base part 460, and the center $C_9$ of the radius of curvature of the ninth reflecting surface $S_9$ is located outside the side emitting lens 450 and above the base part 460.

The refracting part 470 includes a seventh refracting surface $P_7$ and an eighth refracting surface $P_8$. The seventh refracting surface $P_7$ is adjacent to the ninth reflecting surface $S_9$, and the eighth refracting surface $P_8$ is adjacent to the base part 460.

In this case, the seventh refracting surface $P_7$ is a curved surface having a predetermined curvature, and the eighth refracting surface $P_8$ is a flat surface substantially perpendicular to the base part 460. In this exemplary embodiment, the radius of curvature of the seventh refracting surface $P_7$ is 1.8, and the center $C_{10}$ of the radius of curvature of the seventh refracting surface $P_7$ is located inside the side emitting lens 450.

In this exemplary embodiment, the height $H_1$ of the side emitting lens 450, and the distance $H_2$ between the base part 460 and the vertex of the recess of the reflecting part 480 are the same as those in the first exemplary embodiment. The diameter $W_4$ of the inlet of the reflecting part 480, that is, the inlet of the recess, is 9.

As shown in FIG. 11A and FIG. 11C, it is understood that light emitting from the side emitting lens according to the fourth exemplary embodiment of the present invention is minimally emitted from the upper central portion of the side emitting lens where the reflecting part is formed and is maximally emitted from the side surface and the lower surface thereof. That is, it is understood that light is minimally emitted from a portion corresponding to a directional angle of light at 0° (a central portion of the side emitting lens) and the maximum amount of light is emitted from a portion corresponding to a directional angle of light of ±63°. In addition, as shown in FIG. 11B, it is understood that the diameter of the light distribution pattern projected on the lower side of the side emitting lens is about 100.

Figure 12:
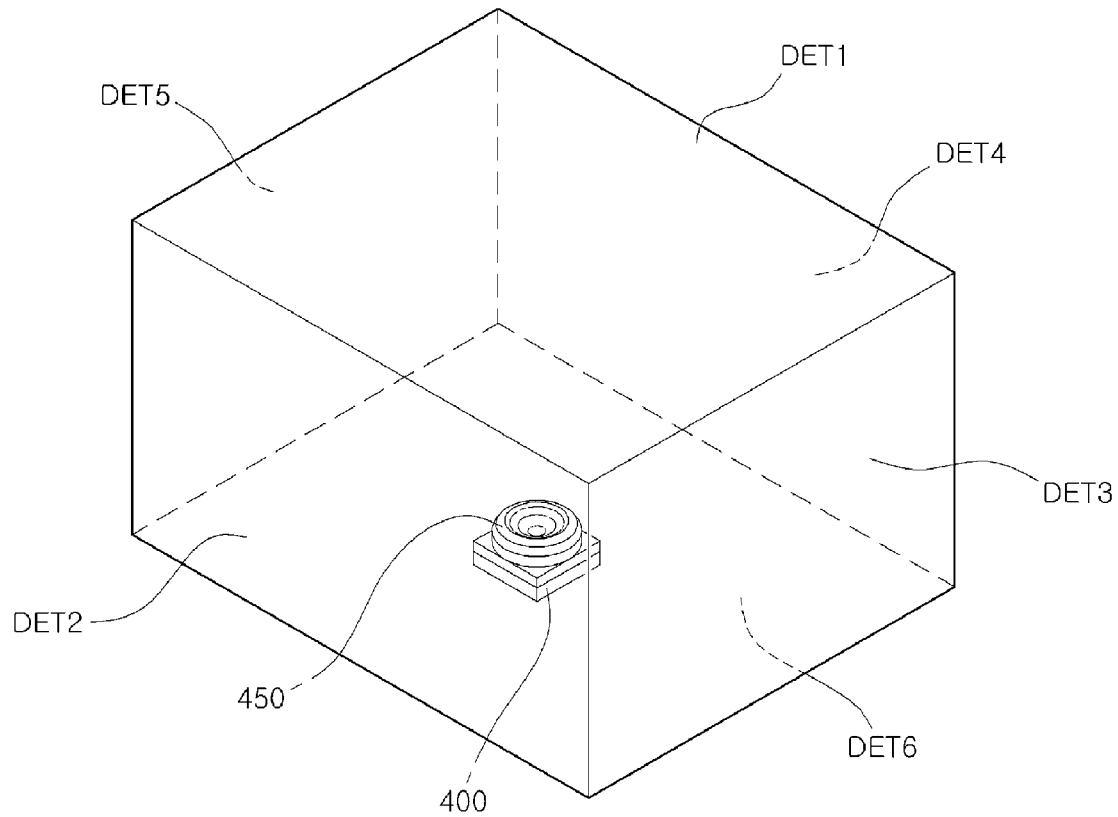
FIG. 12 is a schematic view showing an experimental method of detecting light emitting ratios of the side emitting lens according to exemplary embodiments of the present invention.
Figures 13, 14:
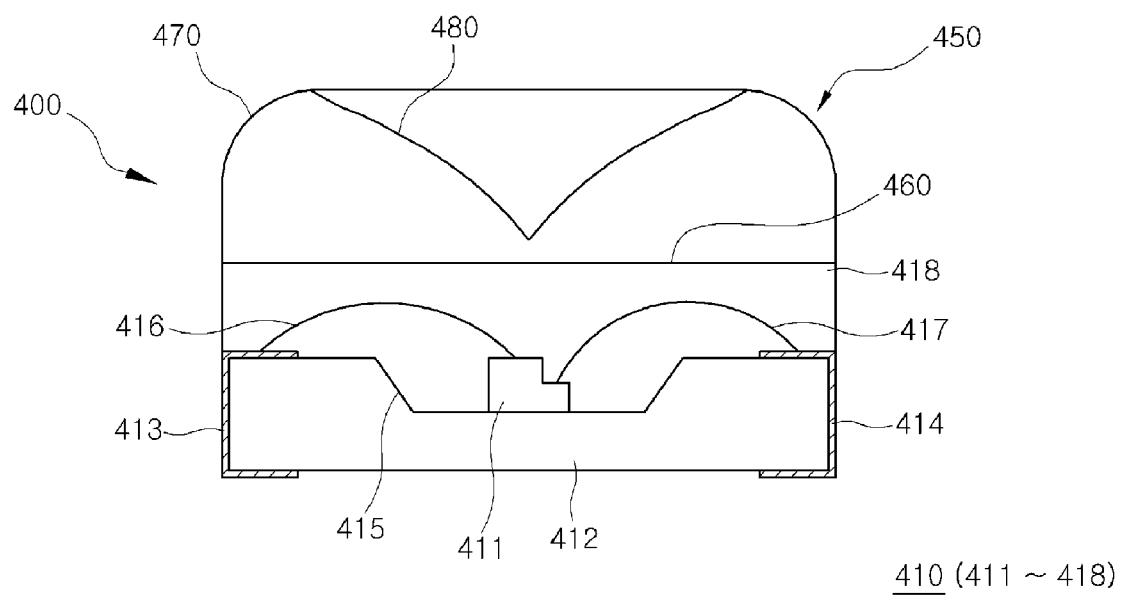
FIG. 13 is a table showing light emitting ratios of the side emitting lens according to the present invention.
FIG. 14 is a cross-sectional view schematically showing a light source unit provided with a side emitting lens according to an exemplary embodiment of the present invention.

FIG. 12 is a schematic view showing an experimental method of detecting light emitting ratio of the side emitting lens according to the present invention, and FIG. 13 is a table showing the light emitting ratios of the side emitting lens according to the present invention.

A light emitting unit 400 provided with a side emitting lens 450 is disposed in a hexahedral box-shaped photodetector, as shown in FIG. 12, and an experiment is performed to detect light emitting ratios in each direction of the side emitting lens according to the present invention. The light emitting ratio is the ratio of light incident on a surface to total light emitted. In this case, the photodetector detects the intensity of light incident on the upper surface DET1, the side surfaces DET2, DET3, DET4, and DET5, and the lower surface DET6.

The light emitting ratios of the side emitting lens according to exemplary embodiments of the present invention will be described with reference to FIG. 13. In the case of the first exemplary embodiment, the light emitting ratio on the upper surface DET1 is 44.42%, and the light emitting ratio on the side surfaces DET2, DET3, DET4, and DET5 and the lower surface DET6 is 36.09%. In the case of the second exemplary embodiment, the light emitting ratio on the upper surface DET1 is 53.6%, and the light emitting ratio on the side surfaces DET2, DET3, DET4, and DET5 and the lower surface DET6 is 34.61%. In the case of the third exemplary embodiment, the light emitting ratio on the upper surface DET1 is 48.66%, and the light emitting ratio on the side surfaces DET2, DET3, DET4, and DET5 and the lower surface DET6 is 40.22%. Further, in the case of the fourth exemplary embodiment, the light emitting ratio on the upper surface DET1 is 28.25%, and the light emitting ratio on the side surfaces DET2, DET3, DET4, and DET5 and the lower surface DET6 is 61.36%. As described above, it is understood that the side emitting lens according to the fourth exemplary embodiment has the greatest emitting efficiency from the side and lower surfaces.

FIG. 14 is a cross-sectional view schematically showing a light source unit provided with the side emitting lens according to the present invention.

Referring to FIG. 14, a light source unit 400 according to the present invention includes a light emitting diode 410 and a side emitting lens 450.

The light emitting diode 410 includes a substrate 412 in which a reflecting hole 415 is formed, a light emitting chip 411 mounted in the reflecting hole 415, first and second leads 413 and 414 disposed on the substrate 412, first and second wires 416 and 417 to connect the light emitting chip 411 to the first and second leads 413 and 414, and a molding part 418 to seal the light emitting chip 411. However, the light emitting diode 410 is not limited to the structure according to this exemplary embodiment and may be modified in various ways.

The side emitting lens 450 is disposed on the molding part 418 of the light emitting diode 410. As described above, the side emitting lens 450 may have a substantially dome-shaped body. The side emitting lens 450 includes a base part 460 forming a bottom of the body, a refracting part 470 forming an outer surface of the body, and a reflecting part 480 disposed on the refracting part 470. Light emitted from the light emitting diode 410 is incident on the base part 460 of the side emitting lens 450. Further, light incident on the base part 460 is fully reflected by the reflecting part 480, so that the light path is changed. Light having a changed light path or light directly incident on the refracting part 470 is refracted by the refracting part 470 and then emitted from the side surfaces or the lower surface of the side emitting lens 450. In this exemplary embodiment, the distance between the light emitting chip 411 and the base part 460 of the side emitting lens 450 is about 0.67, but the invention is not limited thereto.

FIG. 15A, FIG. 15B, FIG. 15C, FIG. 15D, FIG. 15E, and FIG. 15F are views showing the simulation results of light distribution of a backlight unit provided with light source units that each include a conventional side emitting lens, and FIG. 16A, FIG. 16B, FIG. 16C, FIG. 16D, FIG. 16E, and FIG. 16F are views showing the simulation results of light distribution of a backlight unit provided with light source units that each include a side emitting lens according to the present invention. Further, FIG. 17 is a table in which the light emitting ratios of a conventional backlight unit are compared with those of the backlight unit according to the present invention.

This simulation was performed with a backlight unit. In the backlight unit, nine light source units are arrayed in each of three lines and a reflecting sheet is disposed on the lower side of each light source unit. A light guide plate including dot patterns formed on the lower surface thereof is disposed on the upper side of each light source unit.

Figure 15A:
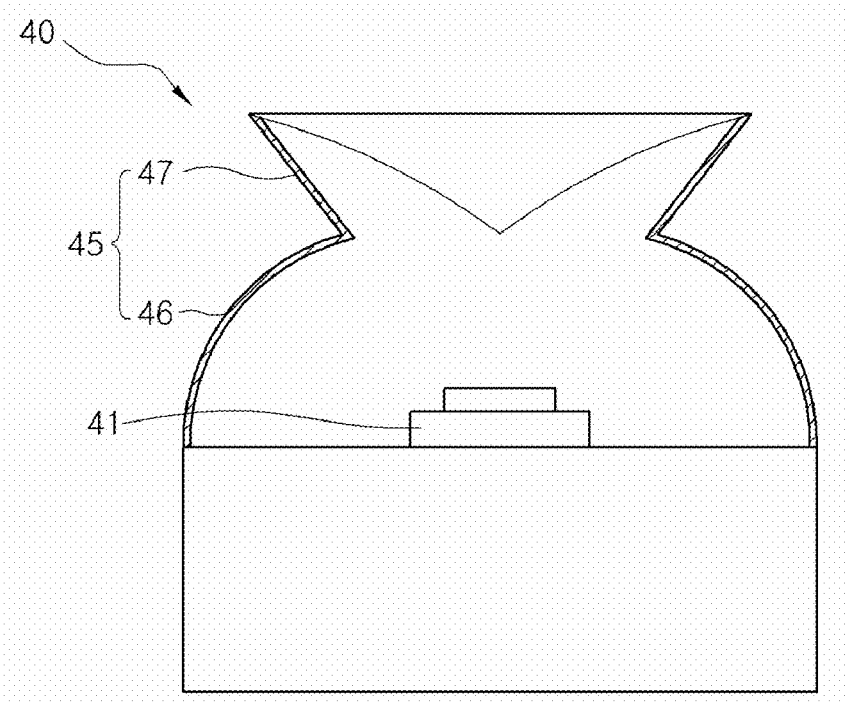
FIG. 15A, FIG. 15B, FIG. 15C, FIG. 15D, FIG. 15E, and FIG. 15F are views showing the simulation results of light distribution of a backlight unit provided with light source units that each include a conventional side emitting lens.
Figure 16A:
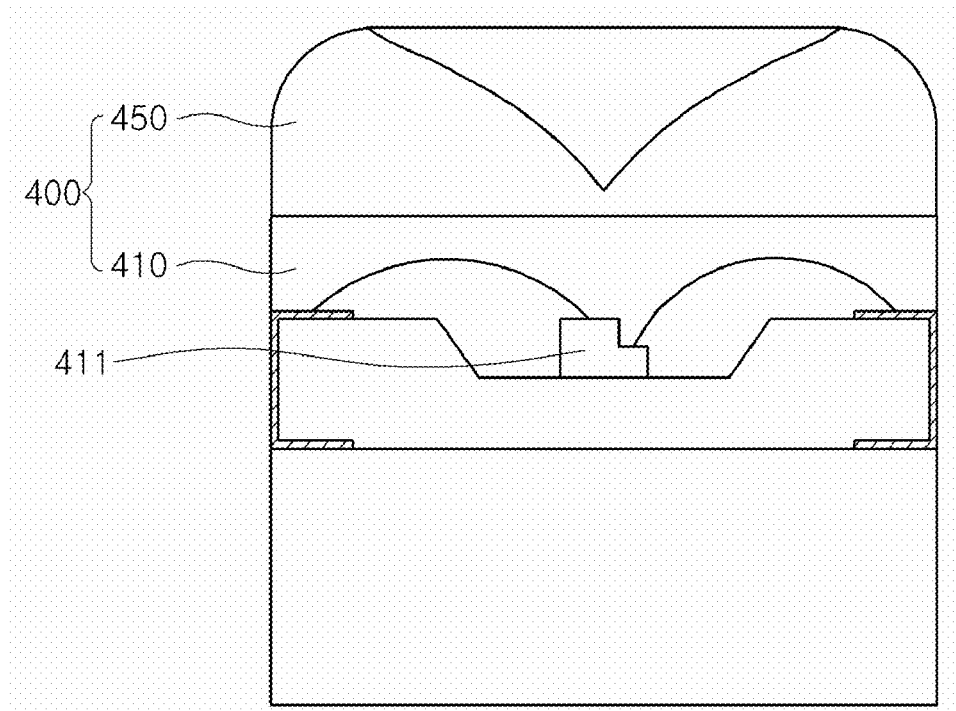
FIG. 16A, FIG. 16B, FIG. 16C, FIG. 16D, FIG. 16E, and 16F are views showing the simulation results of light distribution of a backlight unit provided with light source units that each include a side emitting lens according to an exemplary embodiment of the present invention.

FIG. 15A shows a light source unit in which a conventional side emitting lens is provided, and FIG. 16A shows a light source unit in which a side emitting lens according to the fourth exemplary embodiment of the present invention is provided. The conventional light source unit 40, which is shown in FIG. 15A, includes a light emitting diode 41 and a side emitting lens 45 disposed on the light emitting diode 41. In this case, the side emitting lens 45 includes a substantially dome-shaped refracting part 46 and a reflecting part 47 disposed on the refracting part 46. The reflecting part 47 has the shape of a truncated reverse cone and includes a conical recess formed at the central portion thereof. The light source unit 400 shown in FIG. 16A has the same structure as the light source unit shown in FIG. 14. Accordingly, the description of the light source unit 400 will be omitted.

Figure 15B:
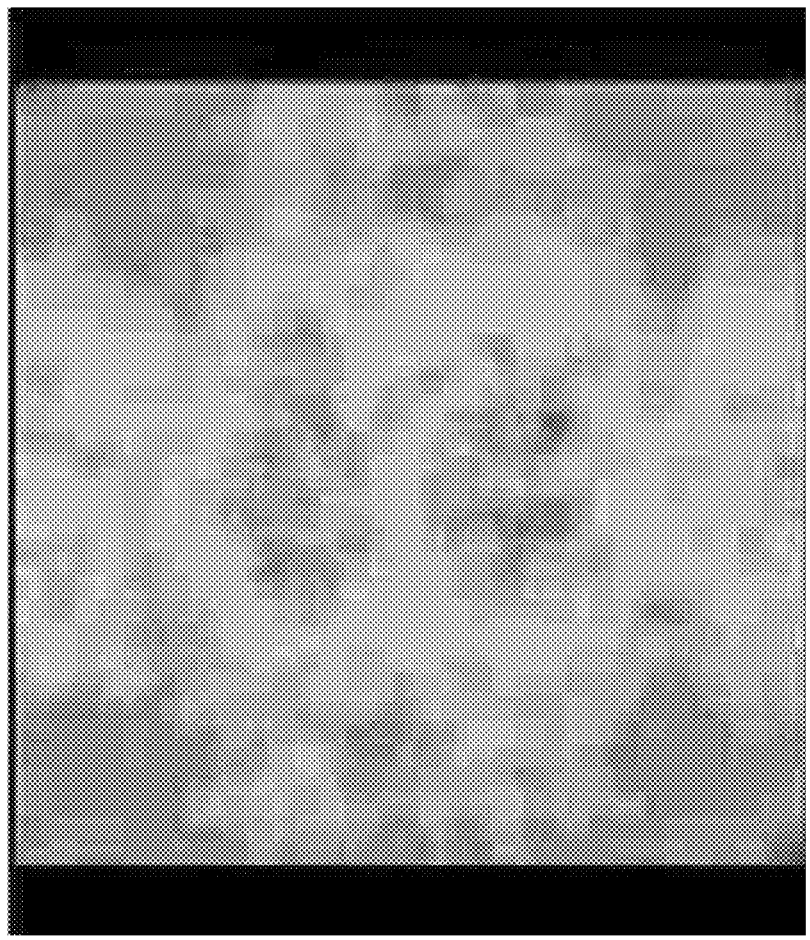
Figure 15C:
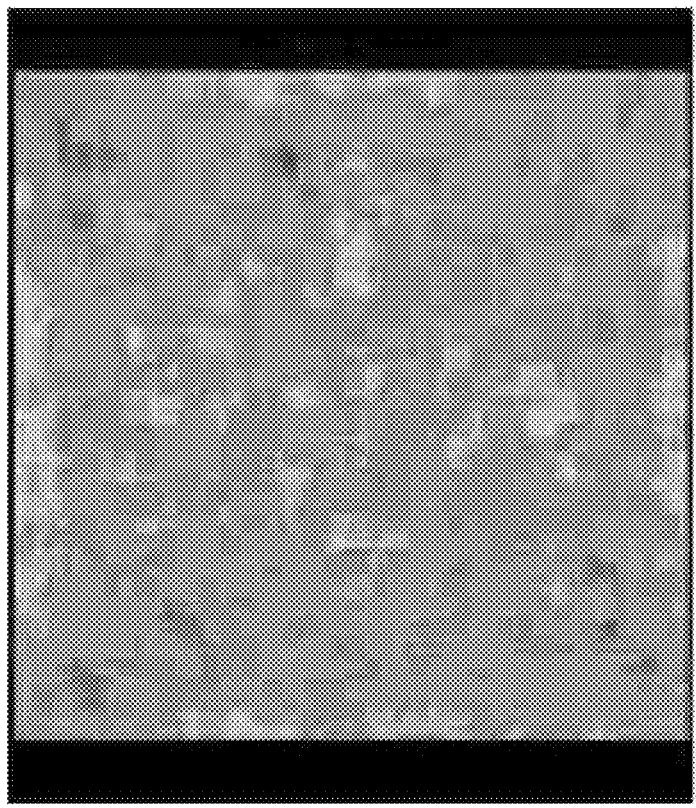
Figure 15D:
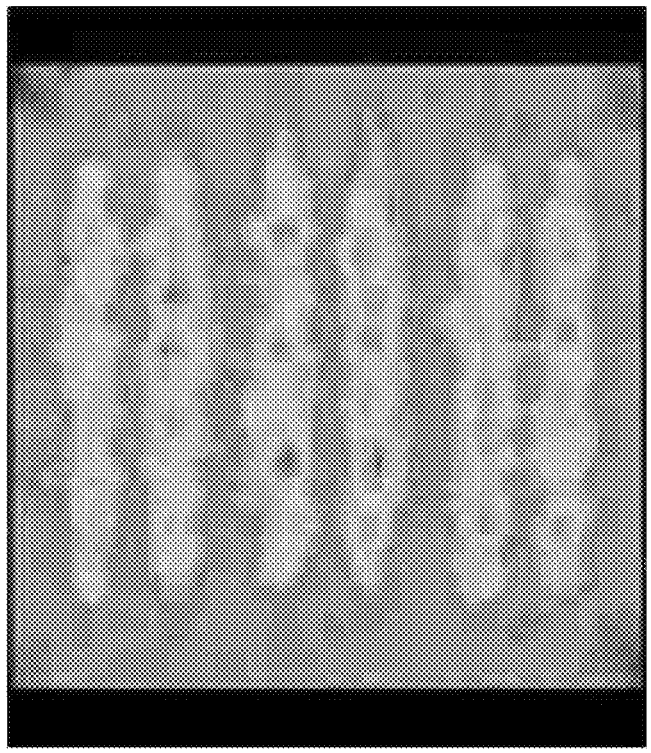
Figure 15E:
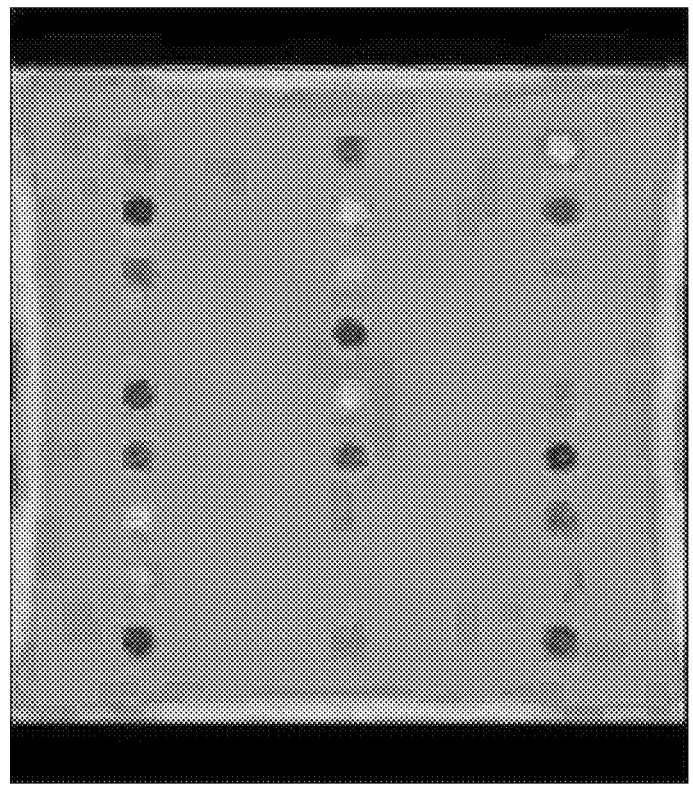
Figure 15F:
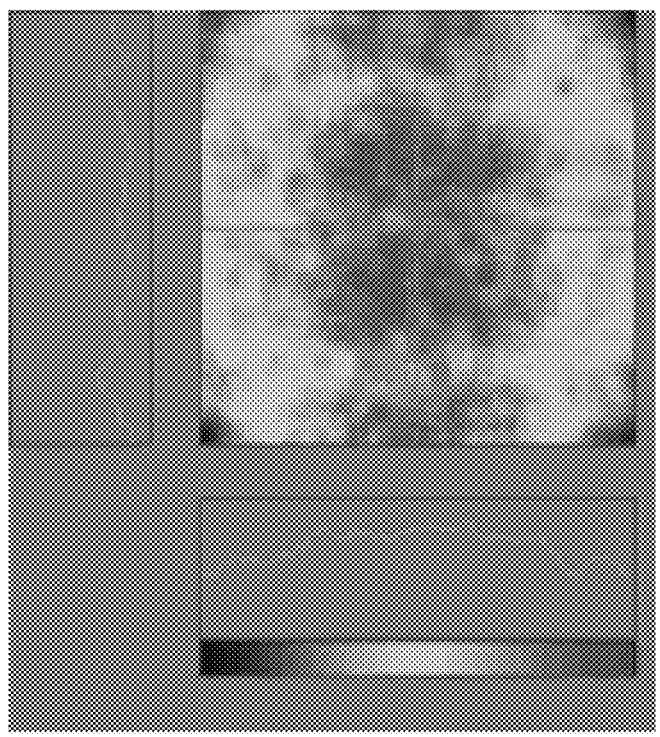
Figure 16B:
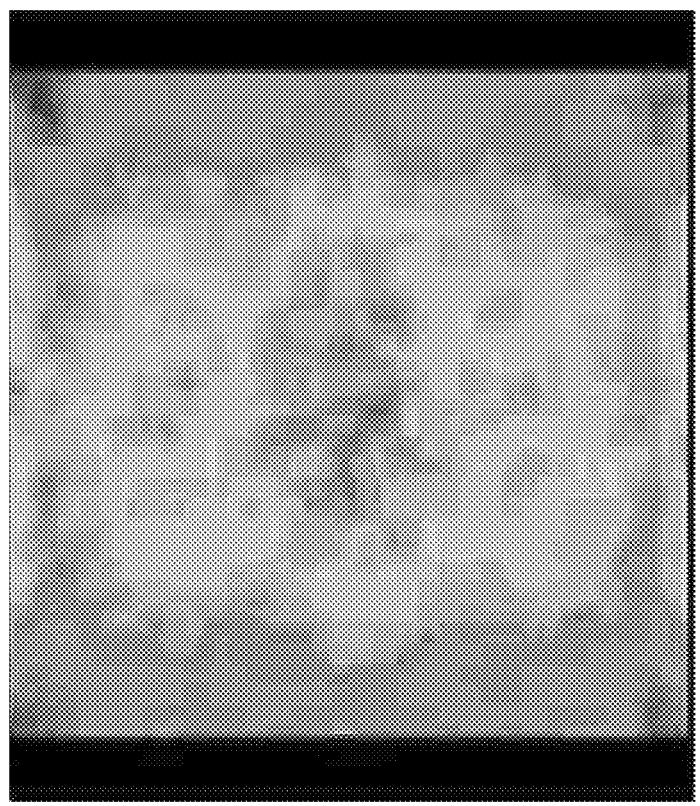
Figure 16C:
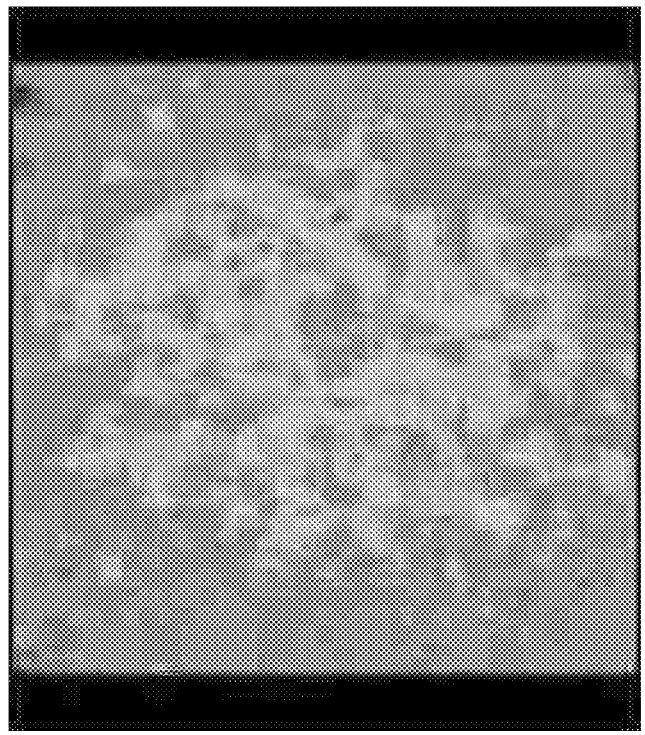
Figure 16D:
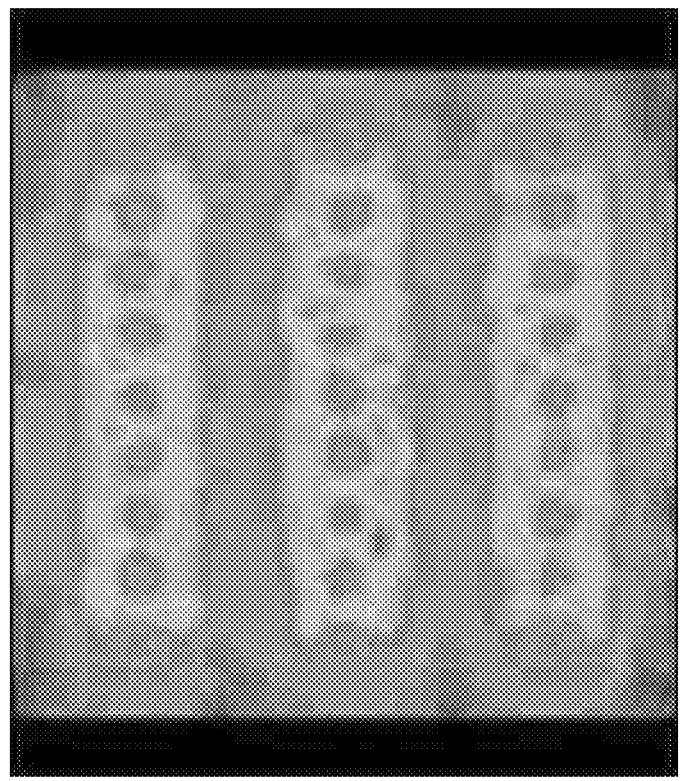
Figure 16E:
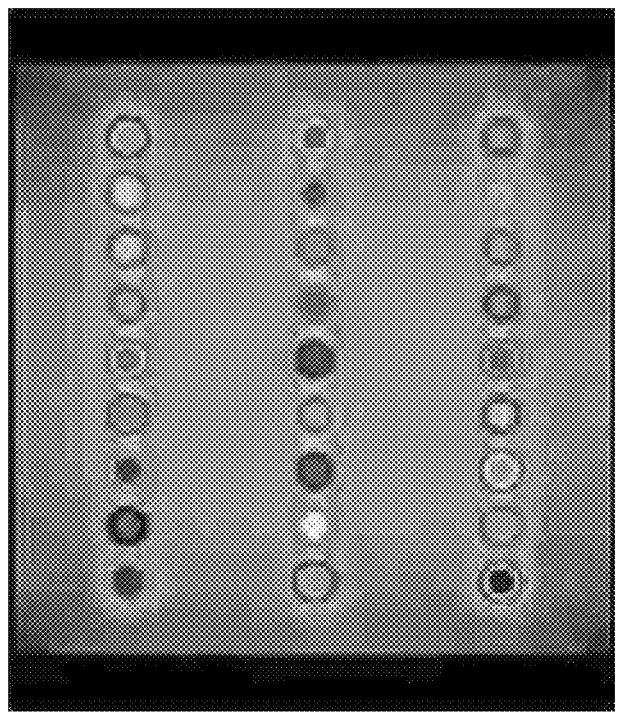
Figure 16F:
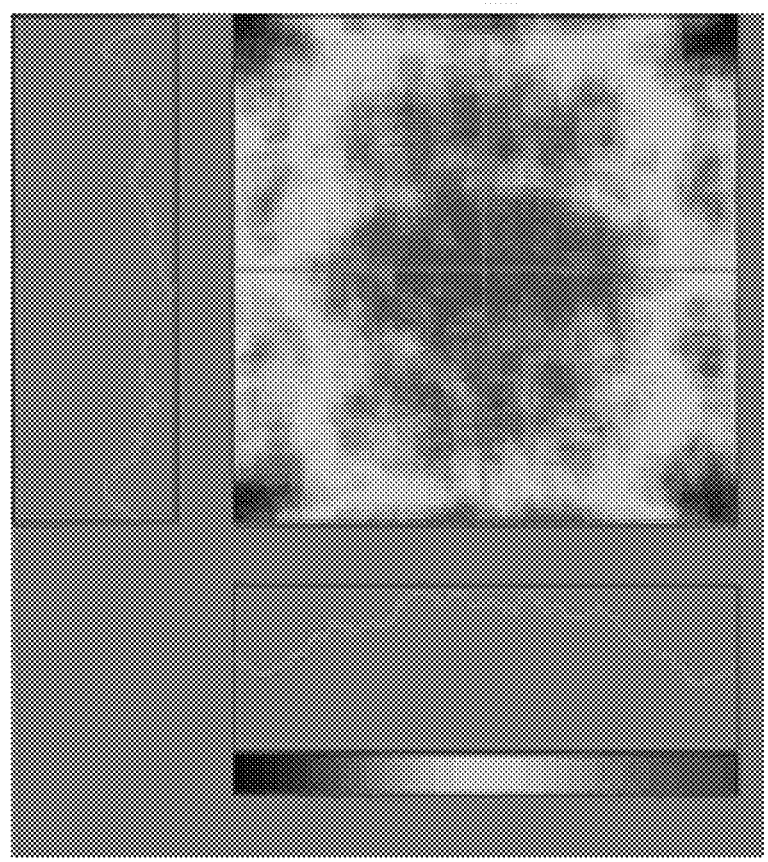

FIG. 15B shows the simulation results of illuminance distribution detected by the photodetector disposed above a light guide plate of conventional light source units, and FIG. 16B shows the simulation results of illuminance distribution detected by a photodetector disposed above a light guide plate of light source units according to the present invention. FIG. 15C shows the simulation results of illuminance distribution of light that passes through the upper surface of the light guide plate disposed above a conventional light source unit, and FIG. 16C shows the simulation results of illuminance distribution of light that passes through the upper surface of a light guide plate disposed above a light source unit according to the present invention. FIG. 15D shows the simulation results of illuminance distribution of light that is incident on the lower surface of a light guide plate disposed above a conventional light source unit, and FIG. 16D shows the simulation results of illuminance distribution of light that is incident on the lower surface of a light guide plate disposed above a light source unit according to the present invention. FIG. 15E shows the simulation results of illuminance distribution of light that is incident on a reflecting sheet disposed below a conventional light source unit, and FIG. 15E shows the simulation results of illuminance distribution of light that is incident on a reflecting sheet disposed below a light source unit according to the present invention. Further, FIG. 15F shows the simulation results of uniformity in illuminance of light that passes through the upper surface of a light guide plate disposed above a conventional light source unit, and FIG. 16F shows the simulation results of uniformity in illuminance of light that passes through the upper surface of a light guide plate disposed above a light source unit according to the present invention.

In addition, light emitting ratios in each direction of a conventional backlight unit will be compared with those of the backlight unit according to the present invention, with reference to FIG. 17. According to the present invention, the light emitting ratio on the upper surface DET1 of the backlight unit is 23.64% and the light emitting ratio on the side surfaces DET2, DET3, DET4, and DET5 and the lower surface DET6 thereof is 50.17%. With a conventional backlight unit, the light emitting ratio on the upper surface DET1 of the backlight unit is 35.3%, and the light emitting ratio on the side surfaces DET2, DET3, DET4, and DET5 and the lower surface DET6 thereof is 41.17%

As described above, the total light emitting ratio on the side surfaces and the lower surface of the backlight unit according to the present invention is about 9% greater than the respective light emitting ratios on the side surfaces and the lower surface of the conventional backlight unit. Further, the light emitting ratio on the upper surface of the backlight unit according to the present invention is about 12% less than the light emitting ratio on the upper surface of the conventional backlight unit.

Figure 18:
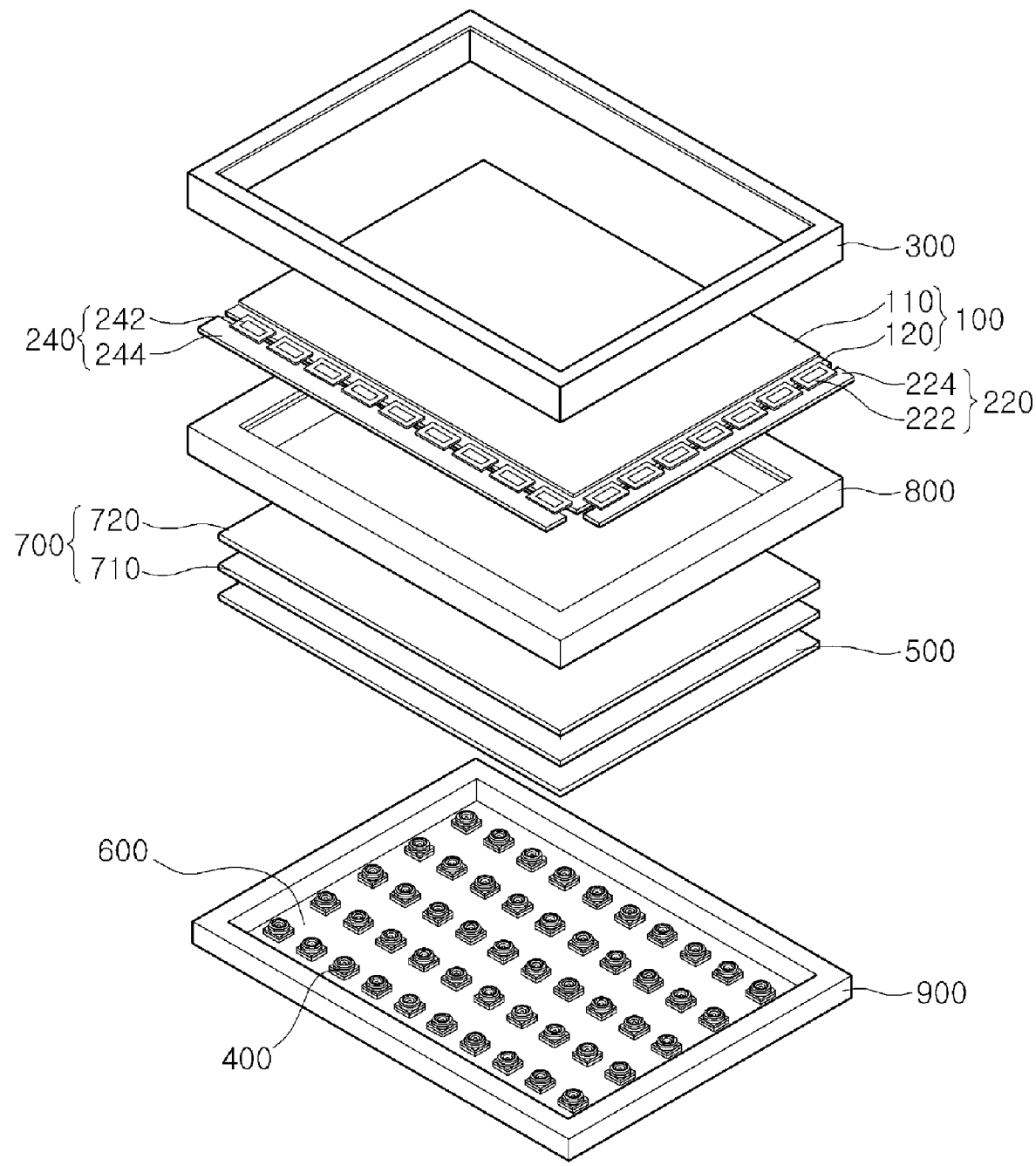
FIG. 18 is an exploded perspective view schematically showing a liquid crystal display provided with light source units that each include a side emitting lens according to an exemplary embodiment of the present invention.

FIG. 18 is an exploded perspective view schematically showing a liquid crystal display provided with light source units that each include a side emitting lens according to the present invention.

Referring to FIG. 18, a liquid crystal display includes an upper chassis 300, a liquid crystal display panel 100, driving circuit units 220 and 240, a light source unit 400, a light guide plate 500, a reflecting sheet 600, a plurality of optical sheets 700, a mold frame 800, and a lower chassis 900.

A predetermined receiving space is formed in the mold frame 800. A backlight unit, which includes the reflecting sheet 600, the light source units 400, the light guide plate 500, and the plurality of optical sheets 700, is disposed in the receiving space of the mold frame 800. The liquid crystal display panel 100 for displaying images is disposed above the backlight unit and it includes a thin film transistor (TFT) substrate 120 and a common electrode substrate 110.

One driving circuit unit 220 includes a gate printed circuit board 224 and a flexible gate printed circuit board 222, and the other driving circuit unit 240 includes a flexible data printed circuit board 242 and a data printed circuit board 244. The gate printed circuit board 224 is connected to the liquid crystal display panel 100 and includes control integrated circuits (ICs) mounted thereon. The gate printed circuit board 224 supplies predetermined gate signals to the gate lines of a TFT substrate 120. The data printed circuit board 244 includes control ICs mounted thereon and supplies predetermined data signals to the data lines of the TFT substrate 120. The flexible gate printed circuit board 222 connects the TFT substrate 120 with the gate printed circuit board 224, and the flexible data printed circuit board 242 connects the TFT substrate 120 with the data printed circuit board 244. The gate and data printed circuit boards 224 and 244 are connected to the flexible gate printed circuit board 222 and the flexible data printed circuit board 242, respectively, to supply gate driving signals and external image signals. In this case, the gate and data printed circuit boards 224 and 244 may be integrated into one printed circuit board. In addition, each of the flexible printed circuit boards 222 and 242 includes a driving IC mounted thereon to transmit red, green, and blue (RGB) signals and electrical power, which are transmitted from the printed circuit boards 224 and 244 to the liquid crystal display panel 100.

Light source units 400 are arrayed in a matrix and each light source unit 400 includes a light emitting diode 410 and a side emitting lens 450 disposed on the light emitting diode 410. Light emitted from the light emitting diode 410 is refracted by the side emitting lens 450 and is emitted from the side surfaces and lower surface of the side emitting lens. For this reason, light is not concentrated on the upper portion of the light emitting diode and the emitted light is distributed over a wider area.

The light guide plate 500 and the plurality of optical sheets 700 are disposed above the light source units 400 to provide a uniform luminance distribution of light emitted from the light source units 400. In this case, dot patterns may be printed on the lower surface of the light guide plate 500 and the plurality of optical sheets 700 may include a diffuse plate 710 and a prism sheet 720. Further, a reflecting sheet 600 is disposed below the light source units 400.

The upper chassis 300 is united with the molded frame 800 so as to cover the edge portions, that is, non-display regions, of the liquid crystal display panel 100 and side and lower surfaces of the molded frame 800. The lower chassis 900 is provided below the molded frame 800 and closes the receiving space of the molded frame.

As described above, according to the present invention, it may be possible to obtain a side emitting lens having side surfaces and a lower surface with improved light emitting ratios and reduced optical loss.

As a result, it may be possible to reduce the number of light emitting diodes used in a backlight unit and also, to reduce cost of materials. Further, since fewer light emitting diodes may be used, it may be possible to manufacture a backlight unit having a smaller size.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. A side emitting lens, comprising:
a body,
wherein the body comprises:
   a base part on which external light is incident,
   a refracting part to refract incident light and emit light from side surfaces of the lens, and
   a reflecting part in the shape of a conical recess at a central portion of the refracting part to fully reflect the incident light toward at least one of the refracting part and the base part, the reflecting part comprising two or more reflecting surfaces, wherein at least two of the two or more reflecting surfaces are curved surfaces,
wherein the reflecting part comprises a first reflecting surface and a second reflecting surface,
wherein the refracting part comprises:
a first refracting surface adjacent to the second reflecting surface,
a third refracting surface adjacent to the base part, and
a second refracting surface formed between the first refracting surface and the third refracting surface,
wherein each of the first reflecting surface, second reflecting surface, and second refracting surface is a curved surface,
wherein each of the first refracting surface and third refracting surface is a flat surface, and
wherein each of the first refracting surface and third refracting surface is inclined with respect to the base part.

2. The side emitting lens of claim 1, a radius of curvature of the first reflecting surface is in the range of 1.3 to 1.5 times of the height of the side emitting lens, a radius of curvature of the second reflecting surface is in the range of 0.4 to 0.6 times of the height of the side emitting lens, and a radius of curvature of the second refracting surface is in the range of 0.2 to 0.4 times of the height of the side emitting lens.

3. The side emitting lens of claim 2, wherein a center of the radius of curvature of the first reflecting surface is located outside the side emitting lens and above the base part, and
centers of the radii of curvature of the second reflecting surface and second refracting surface are located inside the side emitting lens.

4. The side emitting lens of claim 2, a diameter of the base part is in the range of 2.8 to 3 times of the height of the side emitting lens, and a diameter of the recess is in the range of 1.9 to 2.1 times of the height of the side emitting lens.

5. A side emitting lens, comprising:
a body,
wherein the body comprises:
a base part on which external light is incident,
a refracting part to refract incident light and emit light from side surfaces of the lens, and
a reflecting part in the shape of a conical recess at a central portion of the refracting part to fully reflect the incident light toward at least one of the refracting part and the base part, the reflecting part comprising two or more reflecting surfaces, wherein at least two of the two or more reflecting surfaces are curved surfaces,
wherein the reflecting part comprises a first reflecting surface, a second reflecting surface, and a third reflecting surface,
wherein the refracting part comprises:
a first refracting surface adjacent to the third reflecting surface,
a third refracting surface adjacent to the base part, and
a second refracting surface formed between the first refracting surface and the third refracting surface,
wherein each of the first reflecting surface, second reflecting surface, and second refracting surface is a curved surface,
wherein each of the third reflecting surface, first refracting surface, and third refracting surface is a flat surface, and
wherein each of the third reflecting surface, first refracting surface, and third refracting surface is inclined with respect to the base part.

6. The side emitting lens of claim 5, a radius of curvature of the first reflecting surface is in the range of 2.9 to 3.1 times of the height of the side emitting lens, a radius of curvature of the second reflecting surface is in the range of 0.3 to 0.5 times of the height of the side emitting lens, and a radius of curvature of the second refracting surface is in the range of 0.2 to 0.4 times of the height of the side emitting lens.

7. The side emitting lens of claim 5, a radius of curvature of the first reflecting surface is in the range of 1.3 to 1.5 times of the height of the side emitting lens, a radius of curvature of the second reflecting surface is in the range of 0.5 to 0.7 times of the height of the side emitting lens, and a radius of curvature of the second refracting surface is in the range of 0.2 to 0.4 times of the height of the side emitting lens.

8. The side emitting lens of claim 6, wherein a center of the radius of curvature of the first reflecting surface is located below the base part,
a center of the radius of curvature of the second reflecting surface is located outside the side emitting lens and above the base part, and
a center of the radius of curvature of the second refracting surface is located inside the side emitting lens.

9. The side emitting lens of claim 7, wherein a center of the radius of curvature of the first reflecting surface is located below the base part,
a center of the radius of curvature of the second reflecting surface is located outside the side emitting lens and above the base part, and
a center of the radius of curvature of the second refracting surface is located inside the side emitting lens.

10. The side emitting lens of claim 6, a diameter of the base part is in the range of 2.8 to 3 times of the height of the side emitting lens, and a diameter of the recess is in the range of 1.9 to 2.1 times of the height of the side emitting lens.

11. The side emitting lens of claim 7, a diameter of the base part is in the range of 2.8 to 3 times of the height of the side emitting lens, and a diameter of the recess is in the range of 1.9 to 2.1 times of the height of the side emitting lens.

12. A side emitting lens, comprising:
a body,
wherein the body comprises:
a base part on which external light is incident,
a refracting part to refract incident light and emit light from side surfaces of the lens, and
a reflecting part in the shape of a conical recess at a central portion of the refracting part to fully reflect the incident light toward at least one of the refracting part and the base part, the reflecting part comprising two or more reflecting surfaces,
wherein at least two of the two or more reflecting surfaces are curved surfaces,
wherein the reflecting part comprises a first reflecting surface, a second reflecting surface, and a third reflecting surface,
wherein the refracting part comprises a first refracting surface adjacent to the third reflecting surface and a second refracting surface adjacent to the base part,
wherein each of the first reflecting surface, second reflecting surface, third reflecting surface, and first refracting surface is a curved surface,
wherein the second refracting surface is a flat surface, and
wherein the second refracting surface is substantially perpendicular to the base part.

13. The side emitting lens of claim 12, a radius of curvature of the first reflecting surface is in the range of 2.6 to 2.8 times of the height of the side emitting lens, a radius of curvature of the second reflecting surface is in the range of 2.1 to 2.3 times of the height of the side emitting lens, a radius of curvature of the third reflecting surface is in the range of 0.8 to 1 times of the height of the side emitting lens, and a radius of curvature of the first refracting surface is in the range of 0.5 to 0.7 times of the height of the side emitting lens.

14. The side emitting lens of claim 13, wherein centers of the radii of curvature of the first reflecting surface and second reflecting surface are located below the base part,
- a center of the radius of curvature of the third reflecting surface is located outside the side emitting lens and above the base part, and
- a center of the radius of curvature of the first refracting surface is located inside the side emitting lens.

15. The side emitting lens of claim 13, a diameter of the base part is in the range of 3.6 to 3.8 times of the height of the side emitting lens, and a diameter of the recess is in the range of 2.7 to 2.9 times of the height of the side emitting lens.

16. The side emitting lens of claim 1, wherein the side emitting lens comprises a transparent resin having a refractive index of more than 1.

17. A backlight unit, comprising:
- light emitting diodes that each comprise a substrate, a light emitting chip disposed on the substrate, and a molding part to seal the light emitting chip; and
- a side emitting lens disposed on each light emitting diode,
- wherein the side emitting lens has a body,
- the body comprises:
  - a base part on which external light is incident,
  - a refracting part to refract incident light and emit light from side surfaces of the lens, and
  - a reflecting part in the shape of a conical recess at a central portion of the refracting part to fully reflect the incident light toward at least one of the refracting part and the base part, the reflecting part comprising two or more reflecting surfaces,
- wherein at least two of the two or more reflecting surfaces are curved surfaces, and the refracting part comprises at least one refracting surface that is a curved surface,
- wherein the reflecting part comprises a first reflecting surface and a second reflecting surface,
- wherein the refracting part comprises:
  - a first refracting surface adjacent to the second reflecting surface,
  - a third refracting surface adjacent to the base part, and
  - a second refracting surface formed between the first refracting surface and the third refracting surface,
- wherein each of the first reflecting surface, second reflecting surface, and second refracting surface is a curved surface,
- wherein each of the first refracting surface and third refracting surface is a flat surface, and
- wherein each of the first refracting surface and third refracting surface is inclined with respect to the base part.

18. The backlight unit of claim 17, further comprising:
- a reflecting sheet disposed below each light emitting diode;
- a light guide plate disposed on each side emitting lens; and
- a diffuse plate disposed on the light guide plate.

19. The backlight unit of claim 17, the distance between the light emitting chip and the base part is in the range of 0.1 to 0.3 times of the height of the side emitting lens.

* * * * *